United States Patent
Ota et al.

(10) Patent No.: US 9,474,179 B2
(45) Date of Patent: Oct. 18, 2016

(54) ELECTRONIC COMPONENT PACKAGE

(71) Applicant: Panasonic Corporation, Osaka (JP)

(72) Inventors: Yukitoshi Ota, Osaka (JP); Fumito Itou, Osaka (JP); Kiyomi Hagihara, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 14/821,680

(22) Filed: Aug. 7, 2015

(65) Prior Publication Data
US 2015/0359119 A1 Dec. 10, 2015

Related U.S. Application Data

(63) Continuation of application No. PCT/JP2013/005898, filed on Oct. 3, 2013.

(30) Foreign Application Priority Data

Feb. 22, 2013 (JP) ................................ 2013-033325

(51) Int. Cl.
*H05K 5/02* (2006.01)
*H05K 5/00* (2006.01)
(Continued)

(52) U.S. Cl.
CPC ............ *H05K 5/0247* (2013.01); *H01L 23/13* (2013.01); *H01L 23/49827* (2013.01);
(Continued)

(58) Field of Classification Search
CPC .. H05K 5/0247; H05K 5/0004; H05K 1/181; H05K 1/141; H01L 23/13; H01L 23/49827; H01L 23/5384

USPC ....... 361/728, 729, 735, 736, 748, 752, 784, 361/785, 790, 791
See application file for complete search history.

(56) References Cited

U.S. PATENT DOCUMENTS 5,969,952 A * 10/1999 Hayashi ............... H05K 3/3426
257/696
7,049,692 B2 * 5/2006 Nishimura .......... H01L 23/3128
257/686
(Continued)

FOREIGN PATENT DOCUMENTS

JP 7-050357 2/1995
JP 2011-181549 9/2011
(Continued)

OTHER PUBLICATIONS

International Search Report of PCT application No. PCT/JP2013/005898 dated Nov. 5, 2013.

*Primary Examiner* — Anthony Haughton
(74) *Attorney, Agent, or Firm* — McDermott Will & Emery LLP

(57) ABSTRACT

Provided is an electronic component package that does not lower reliability while enabling miniaturization and high performance of the electronic component package. The electronic component package includes a main substrate, a first electronic component provided on a main surface of the main substrate, a frame body disposed so as to face the main surface of the main substrate, and a first connection terminal and a second connection terminal disposed on the main surface of the main substrate along a first side of the frame body. The second connection terminal is disposed on the first side of the frame body at a position facing a vicinity of a midpoint of a side of the first electronic component, and the second connection terminal has an area larger than an area of the first connection terminal.

15 Claims, 25 Drawing Sheets

(51) Int. Cl.
*H01L 23/13* (2006.01)
*H01L 23/498* (2006.01)
*H01L 23/538* (2006.01)
*H05K 1/14* (2006.01)
*H05K 1/18* (2006.01)

(52) U.S. Cl.
CPC ......... *H01L 23/5384* (2013.01); *H05K 1/141* (2013.01); *H05K 5/0004* (2013.01); *H01L 2224/16225* (2013.01); *H01L 2224/32225* (2013.01); *H01L 2224/48091* (2013.01); *H01L 2224/48227* (2013.01); *H01L 2224/73204* (2013.01); *H01L 2224/73265* (2013.01); *H05K 1/181* (2013.01); *H05K 2201/2018* (2013.01)

(56) References Cited

U.S. PATENT DOCUMENTS

| | | | | |
|---|---|---|---|---|
| 7,456,495 B2* | 11/2008 | Pohl | ............ | H01L 23/3128 257/686 |
| 8,050,443 B2* | 11/2011 | Izuchi | ............ | H04R 19/016 381/174 |
| 8,158,888 B2* | 4/2012 | Shen | ............ | H01L 23/3128 174/255 |
| 8,685,792 B2* | 4/2014 | Chow | ............ | H01L 25/03 257/678 |
| 9,147,644 B2* | 9/2015 | Standing | ............ | H01L 23/492 |
| 2008/0289853 A1 | 11/2008 | Sakai et al. | | |
| 2011/0114353 A1 | 5/2011 | Iizuka et al. | | |
| 2011/0210434 A1 | 9/2011 | Yamashita | | |
| 2011/0286194 A1* | 11/2011 | Kawabata | ............ | H05K 1/141 361/803 |
| 2011/0317386 A1* | 12/2011 | Kawabata | ............ | H05K 1/141 361/772 |
| 2012/0256322 A1* | 10/2012 | Itou | ............ | H01L 21/563 257/778 |
| 2013/0021760 A1* | 1/2013 | Kim | ............ | H01L 25/0657 361/729 |
| 2013/0221508 A1 | 8/2013 | Yamashita | | |
| 2014/0054080 A1* | 2/2014 | Sato | ............ | H05K 1/183 174/266 |
| 2016/0172286 A1* | 6/2016 | Kim | ............ | H01L 23/49816 361/767 |

FOREIGN PATENT DOCUMENTS

| | | |
|---|---|---|
| WO | 2007/110985 | 10/2007 |
| WO | 2007/116544 | 10/2007 |
| WO | 2009/025320 | 2/2009 |

* cited by examiner

ELECTRONIC COMPONENT PACKAGE

BACKGROUND OF THE INVENTION

1. Field of the Invention

The present disclosure relates to an electronic component package where a frame body is mounted on a substrate.

2. Description of the Related Art

Conventionally, as an example of a package where an electronic component is mounted on a substrate, there is an electronic component package where an electronic component and a frame body having an external terminal are mounted on a substrate (refer to PTL 1, for example).

CITATION LIST

Patent Literature

PTL 1: Unexamined Japanese Patent Publication No. H07-050357

However, stress on a connection part between a main substrate and the frame body becomes high in the conventional structure. Particularly at the connection part, there is a problem in that the stress on a place facing a side of a semiconductor chip mounted on the main substrate becomes high. In recent years, while the electronic component package is miniaturized, performance of the package improves. As a size of the mounted electronic component or a number of the external terminals increases, this stress problem becomes conspicuous, and reliability of the electronic component package can be lowered.

SUMMARY OF THE INVENTION

In consideration of the above-described problem, an object of the present disclosure is to provide an electronic component package that does not lower reliability while enabling miniaturization and high performance of the electronic component package.

To solve the above-described problem, the following solutions are provided. In other words, an electronic component package of the present disclosure includes a main substrate, a first electronic component provided on a main surface of the main substrate, a frame body disposed so as to face the main surface of the main substrate, and a first connection terminal and a second connection terminal, each of which is disposed on the main surface of the main substrate along a first side of the frame body. Further, the second connection terminal is disposed on the first side of the frame body at a position facing a vicinity of a midpoint of a side of the first electronic component, and the second connection terminal has an area larger than an area of the first connection terminal.

Further, a side of the second connection terminal in a direction parallel to the first side is longer than a side of the first connection terminal.

Further, a side of the second connection terminal in a direction perpendicular to the first side is longer than the side of the first connection terminal.

Further, resin is filled between the main surface of the main substrate and the frame body at a portion of the first side.

Further, the first electronic component is disposed on the main surface of the main substrate via resin which is the same as the resin filled between the main surface of the main substrate and the frame body.

Further, in the electronic component package, a second electronic component is provided on the main surface of the main substrate, and the first electronic component has an area larger than an area of the second electronic component.

Further, the first electronic component is a semiconductor chip.

Further, a width of a side of a bottom surface of the frame body at a position facing the second connection terminal is wider than the width of the side of the bottom surface of the frame body at another position.

Further, the second connection terminal is a dummy terminal.

Further, the second connection terminal is connected to a ground part.

Further, a first external terminal and a second external terminal are disposed on the bottom surface of the frame body, the second external terminal is electrically connected with the second connection terminal, and the second external terminal has an area larger than an area of the first external terminal.

Further, in the electronic component package, a third external terminal and a fourth external terminal are disposed on a main surface of the frame body, and the fourth external terminal has an area larger than an area of the third external terminal.

Further, the fourth external terminal is provided at a position facing the second external terminal.

Further, the forth external terminal is provided on the main surface of the frame body at a corner of a side, of sides on the main surface, facing the first side.

Further, the first side of the frame body is a side, of the respective sides of the frame body, whose distance from the first electronic component is the shortest.

According to the present disclosure, the electronic component package that does not lower reliability while enabling miniaturization and high performance of the electronic component package can be provided.

DETAILED DESCRIPTION OF THE PREFERRED EMBODIMENTS

Hereinafter, a structure where a semiconductor chip is mounted on only one surface of a main substrate will be described in each exemplary embodiment. However, the present disclosure also includes a case where the semiconductor chip is mounted on both surfaces of the main substrate.

Further, a case where the semiconductor chip is used as an example of an electronic component mounted on the main substrate will be described in each exemplary embodiment. However, the present disclosure also includes a case where the other electronic component is mounted. Further, materials in each exemplary embodiment are examples and do not limit materials used in the present disclosure.

First Exemplary Embodiment

Figure 1A:
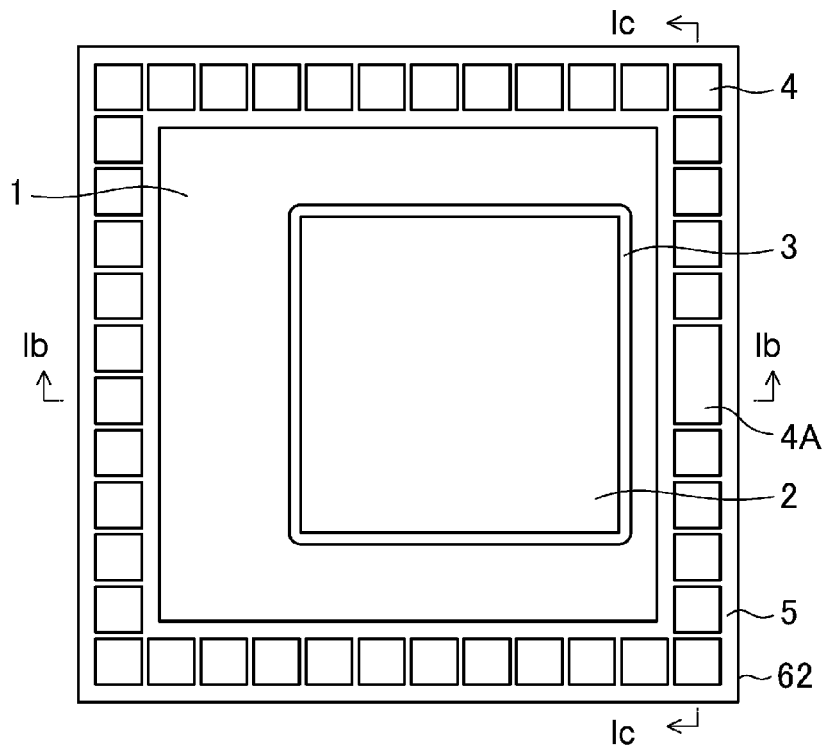
FIG. 1A is a plan view of an electronic component package according to a first exemplary embodiment.
Figure 1B:
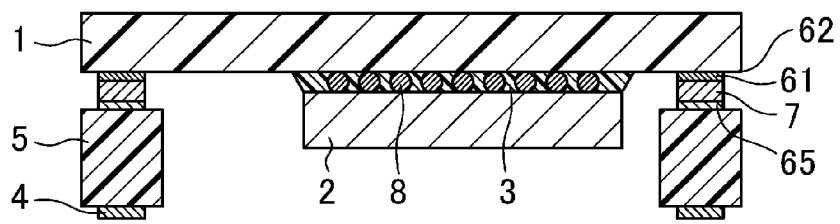
FIG. 1B is a sectional view between Ib-Ib in FIG. 1A.
Figure 1C:
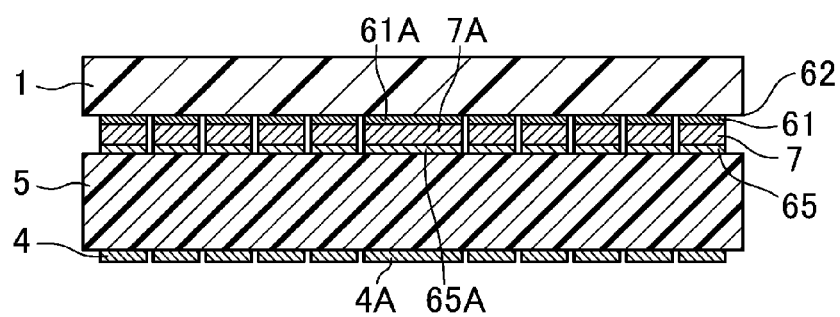
FIG. 1C is a sectional view between Ic-Ic in FIG. 1A.

A structure of an electronic component package according to a first exemplary embodiment will be described with reference to FIGS. 1A to 3. FIG. 1A is a plan view of the electronic component package, when viewed from an external terminal side, according to the present exemplary embodiment. FIG. 1B is a sectional view between Ib-Ib in FIG. 1A, and FIG. 1C is a sectional view between Ic-Ic in FIG. 1A.

In the electronic component package in the present exemplary embodiment, semiconductor chip 2 serving as a first electronic component is mounted on main substrate 1 via joint metal 8, and underfill 3 is injected between main substrate 1 and semiconductor chip 2. Further, main substrate 1 and frame body 5 are disposed so that main surfaces face each other.

Main substrate 1 is formed of, for example, resin, ceramic, or Si and has a thickness of 20 μm to 1000 μm. Further, main substrate 1 is a rectangle whose length of one side is about 2 mm to 50 mm. Although not illustrated in FIGS. 1A to 3, a wiring line or a circuit may be formed on main substrate 1.

Semiconductor chip 2 is a rectangle whose length of one side is about 1 mm to 30 mm, and has a thickness of 10 μm to 800 μm. In the description of the present exemplary embodiment, a shape of semiconductor chip 2 is described as a square.

Joint metal 8 is formed of, for example, solder and has a diameter of 5 μm to 300 μm. Although not illustrated in FIGS. 2A and 2B, semiconductor chip 2 and main substrate 1 respectively have terminals. Joint metal 8 is connected to semiconductor chip 2 and main substrate 1 by these terminals.

Underfill 3 is formed of, for example, resin and is filled between semiconductor chip 2 and main substrate 1.

Further, on the main surface of main substrate 1, a plurality of connection terminals 61 serving as first connection terminals is disposed along each side of main substrate 1. On a bottom surface of frame body 5, a plurality of external terminals 4 serving as first external terminals are disposed along each side of frame body 5. Further, a plurality of connection terminals 65 serving as third connection terminals is formed on the main surface of frame body 5. Connection terminal 65 is disposed along each side of frame body 5 and connects external terminal 4 and connection terminal 61 of main substrate 1. Each connection terminal 61 and each connection terminal 65 are connected via joint metal 7. With this configuration, frame body 5 is mounted on main substrate 1.

Connection terminals 61, 65 and external terminal 4 are formed of, for example, Cu, Ni, or Au. Each of connection terminals 61, 65 and external terminal 4 is a rectangle whose length of one side is about 10 µm to 1000 µm, and has a thickness of 1 µm to 50 µm. Joint metal 7 is formed of, for example, solder and has a thickness of 2 µm to 1000 µm.

Frame body 5 is formed of, for example, resin, ceramic, or Si and has a thickness of 20 µm to 1500 µm. Although not illustrated in FIGS. 1A to 3, external terminal 4 and connection terminal 65 are connected inside frame body 5 by a wiring line, a penetration electrode, or the like. Not only external terminal 4 and connection terminal 65 which face each other are connected, but also external terminal 4 and connection terminal 65 which do not face each other may be connected.

Here, on the bottom surface of frame body 5, external terminal 4 disposed at a center of the side, of the respective sides of frame body 5, whose distance from semiconductor chip 2 is the shortest serves as external terminal 4A (a second external terminal). Further, on the main surface of frame body 5, connection terminal 65 disposed at the center of the side, of the respective sides of frame body 5, whose distance from semiconductor chip 2 is the shortest serves as connection terminal 65A (a fourth external terminal). Further, connection terminal 61 disposed at a center of first side 62, of the respective sides of main substrate 1, whose distance from semiconductor chip 2 is the shortest serves as connection terminal 61A (a second connection terminal). Further, a joint metal of joint metals 7 disposed between connection terminal 61A and connection terminal 65A serves as joint metal 7A. External terminal 4A, connection terminal 61A, connection terminal 65A, and joint metal 7A face each other and are disposed in an overlapping manner in a plan view. Moreover, external terminal 4A has an area larger than those of other external terminals 4, connection terminal 61A has an area larger than those of other connection terminals 61, connection terminal 65A has an area larger than those of other connection terminals 65, and joint metal 7A has an area larger than those of other joint metals 7.

Here, more specifically, it is preferable that a position at which external terminal 4A is disposed be a position facing a vicinity of a midpoint of the side included in semiconductor chip 2. This is because, as illustrated in a simulation result described below, high stress is applied to the external terminal that exists at the position facing the vicinity of the midpoint of the side included in semiconductor chip 2. Further, in the same manner, it is preferable that a position at which connection terminal 65A, connection terminal 61A, or joint metal 7A is disposed be a position facing the vicinity of the midpoint of the side included in semiconductor chip 2. The same applies to each variation described below.

Further, as mentioned above, on the bottom surface of frame body 5, and on the side, of the respective sides of frame body 5, whose distance from semiconductor chip 2 is at least the shortest, it is preferable that external terminal 4A be disposed at the position facing the vicinity of the midpoint of the side included in semiconductor chip 2. However, external terminal 4A may be disposed at a position facing a vicinity of a midpoint of the other side included in semiconductor chip 2. This is because, as illustrated in the simulation result described below, on the side of the respective sides of frame body 5 other than the side whose distance from semiconductor chip 2 is the shortest, stress is also generated on the external terminal that exists at the position facing the vicinity of the midpoint of the side included in semiconductor chip 2. In the same manner, on the side of the respective sides of frame body 5 other than the side whose distance from semiconductor chip 2 is the shortest, connection terminal 65A, connection terminal 61A, or joint metal 7A may also be disposed at a position facing a vicinity of a midpoint of the side included in semiconductor chip 2. The same applies to each variation described below.

Figure 2A:
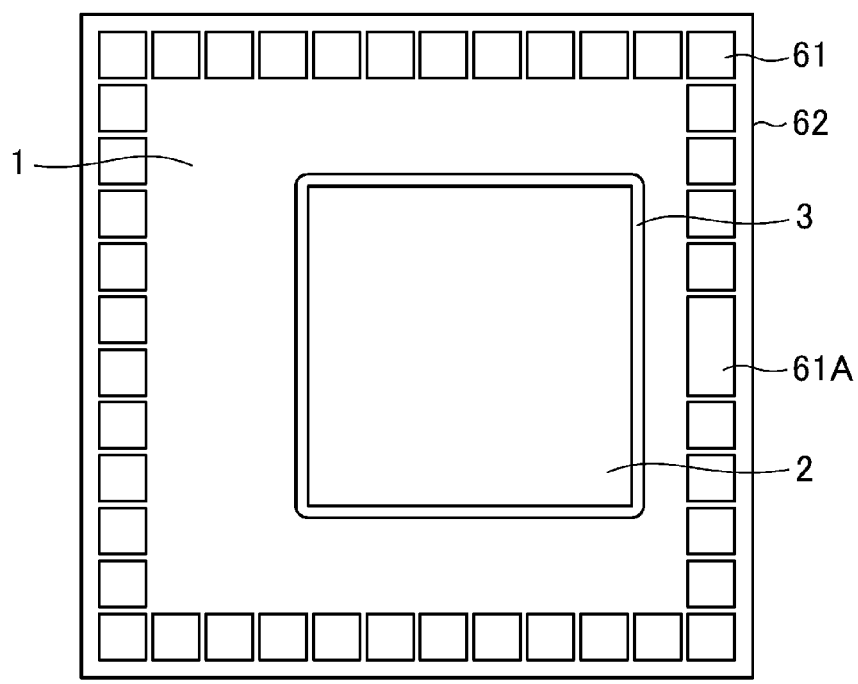
FIG. 2A is a plan view of a main substrate of the electronic component package in FIG. 1A.
Figure 2B:
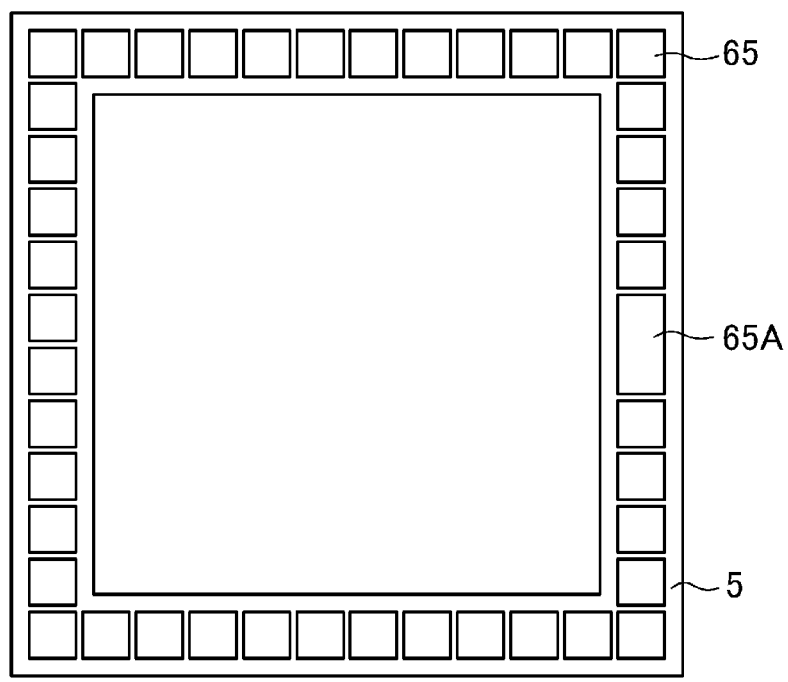
FIG. 2B is a plan view of a frame body of the electronic component package in FIGS. 1A to 1C.

FIG. 2A is a plan view illustrating the main surface of the main substrate of the electronic component package according to the present exemplary embodiment. FIG. 2B is a plan view illustrating the main surface of the frame body of the electronic component package according to the present exemplary embodiment.

As illustrated in FIGS. 2A and 2B, at connection terminal 61A of main substrate 1, a side of in a direction parallel to first side 62 is longer than that of other connection terminal 61. Connection terminal 61A has an area larger than that of other connection terminal 61. Further, connection terminal 65A of frame body 5 has an area larger than that of the other connection terminal 65.

Figure 3:
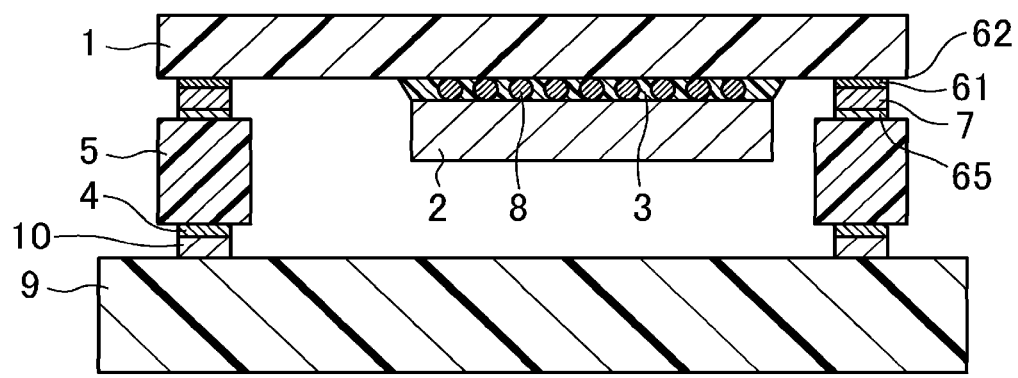
FIG. 3 is a schematic view illustrating a section when secondary mounting is performed on the electronic component package in FIGS. 1A to 1C.

FIG. 3 is a sectional view when secondary mounting is performed on the electronic component package in FIGS. 1A to 1C. In FIG. 3, the electronic component package is mounted on substrate 9 by joint metal 10 formed on external terminal 4. Joint metal 10 is formed of, for example, solder and has a thickness of 2 µm to 1000 µm. Substrate 9 is formed of, for example, resin, ceramic, Si and has a thickness of 50 µm to 4000 µm. Although not illustrated, a wiring line or a circuit may be formed on substrate 9.

Next, an example of a manufacturing method of the electronic component package according to the present exemplary embodiment will be described with reference to FIGS. 4A to 4C.

Figure 4A:
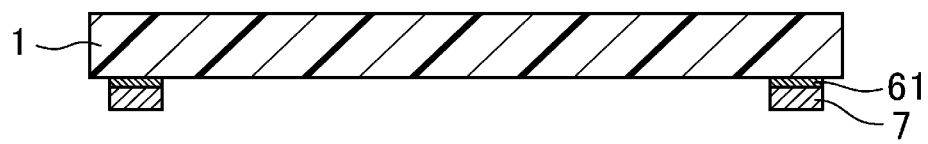
FIG. 4A is a diagram illustrating an example of a manufacturing process of the electronic component package in FIGS. 1A to 1C.

First, as illustrated in FIG. 4A, joint metal 7 is formed on connection terminal 61 formed on main substrate 1 by using, for example, a printing method. At this time, joint metal 8 for connecting semiconductor chip 2 and main substrate 1 may also be formed simultaneously with joint metal 7.

Figure 4B:
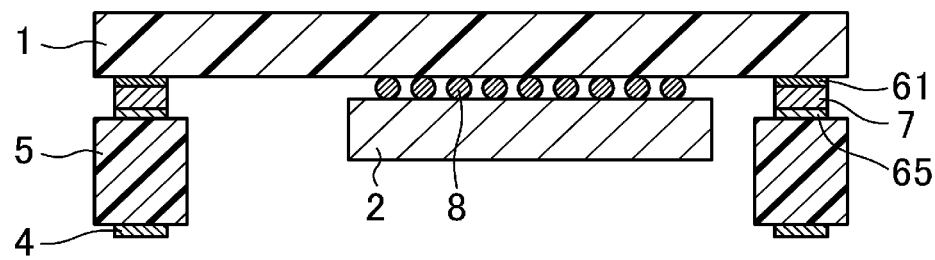
FIG. 4B is a diagram illustrating the example of the manufacturing process of the electronic component package in FIGS. 1A to 1C.

Next, as illustrated in FIG. 4B, joint metal 8 is formed on main substrate 1, and frame body 5 and external terminal 4 are formed on joint metal 7 in this order. Further, semiconductor chip 2 is mounted on joint metal 8.

Figure 4C:
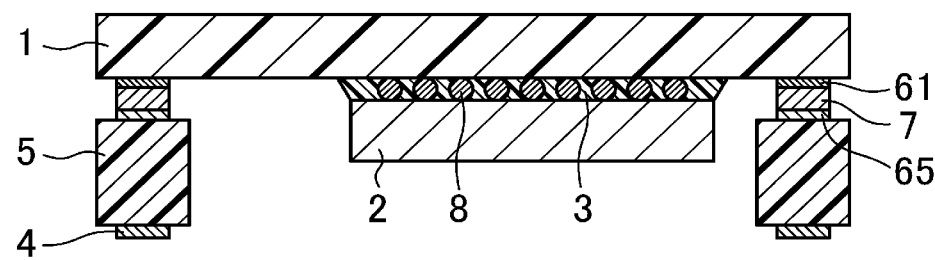
FIG. 4C is a diagram illustrating the example of the manufacturing process of the electronic component package in FIGS. 1A to 1C.

Eventually, as illustrated in FIG. 4C, underfill 3 is charged between main substrate 1 and semiconductor chip 2. Heat is applied to underfill 3, thereby causing underfill 3 to be cured and shrunk.

It should be noted that the present disclosure is not limited by the manufacturing method illustrated in FIGS. 4A to 4C.

Hereinafter, results of simulation of stress applied to connection parts of another secondary mounted electronic component package will be described with reference to FIGS. 5A to 7 in order to compare with the electronic component package according to the present exemplary embodiment.

Figure 5A:
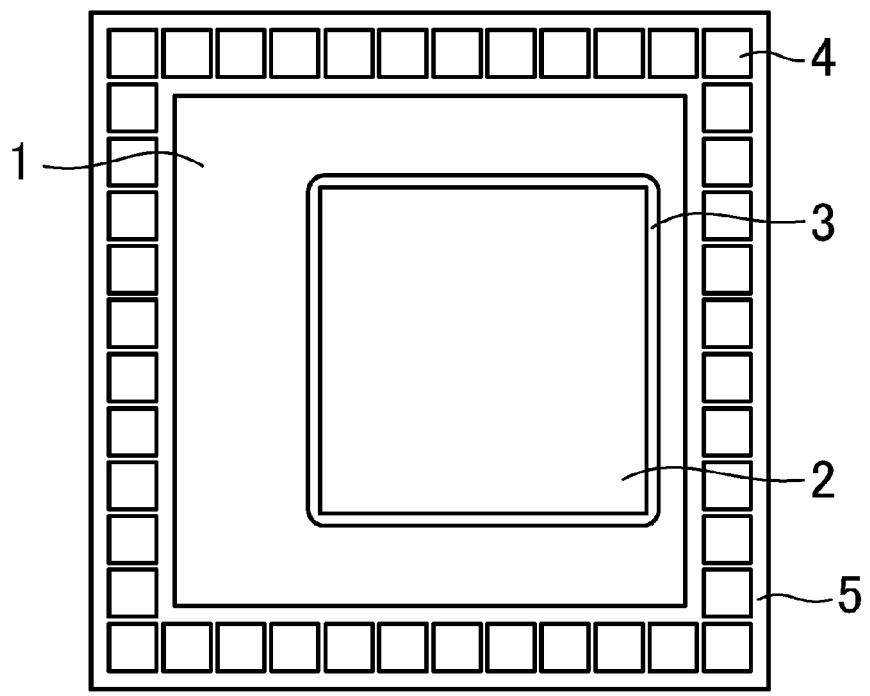
FIG. 5A is a plan view of an electronic component package used for simulation to compare with the electronic component package in FIGS. 1A to 1C.
Figure 5B:
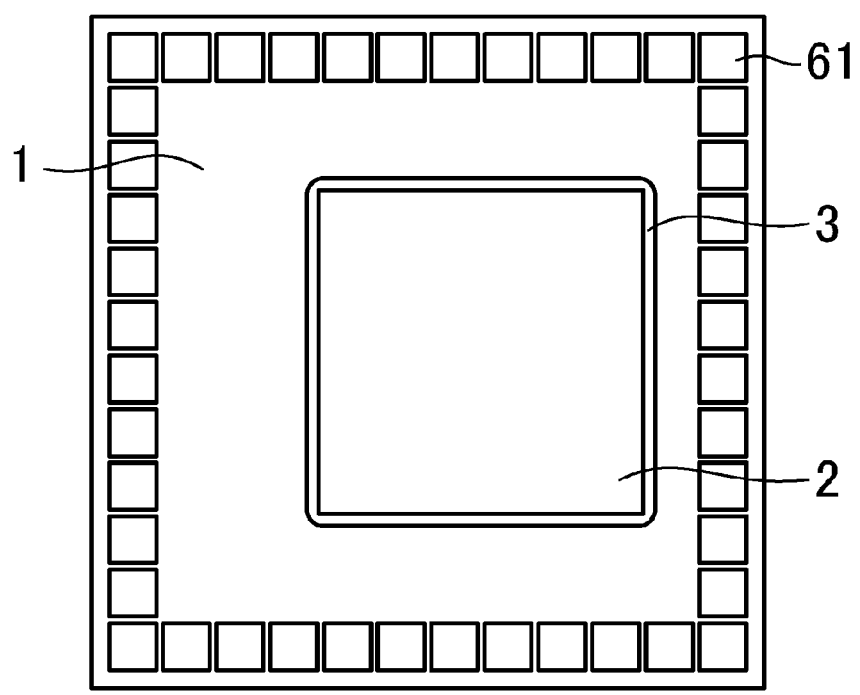
FIG. 5B is a plan view of an electronic component package used for simulation, from which a frame body is omitted, to compare with the electronic component package in FIGS. 1A to 1C.
Figure 5C:
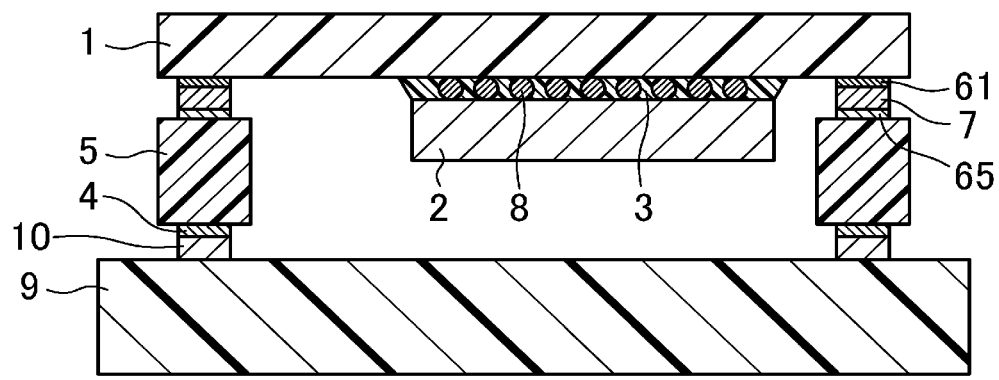
FIG. 5C is a sectional view of the electronic component package used for simulation to compare with the electronic component package in FIGS. 1A to 1C.

FIGS. 5A to 5C are schematic views of a simulated electronic component package. FIG. 5A is a plan view of the simulated electronic component package. FIG. 5B is a plan view of the electronic component package from which a frame body is omitted. FIG. 5C is a schematic view of a section when the electronic component package is secondary mounted on a substrate.

The electronic component package illustrated in FIGS. 5A to 5C is different from the electronic component package according to the present exemplary embodiment in that external terminals 4, connection terminals 61 of main substrate 1, connection terminals 65 of frame body 5, joint metals 7, and joint metals 10 respectively have the same sizes. It should be noted that a shape of semiconductor chip 2 is a square.

Figure 6A:
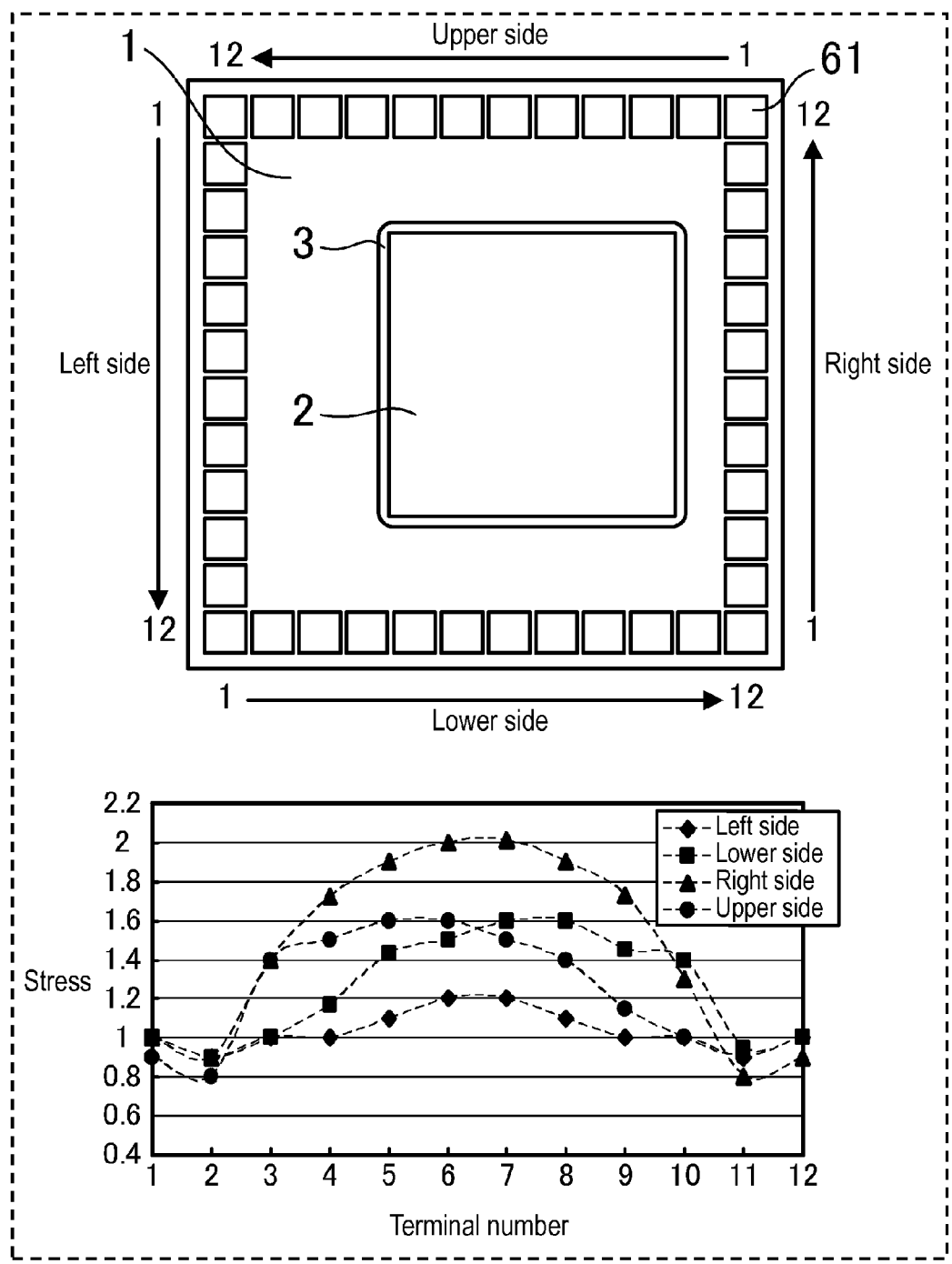
FIG. 6A is a diagram for explaining a simulation result of stress applied to a joint metal of a main substrate illustrated in FIG. 5C.
Figure 6B:
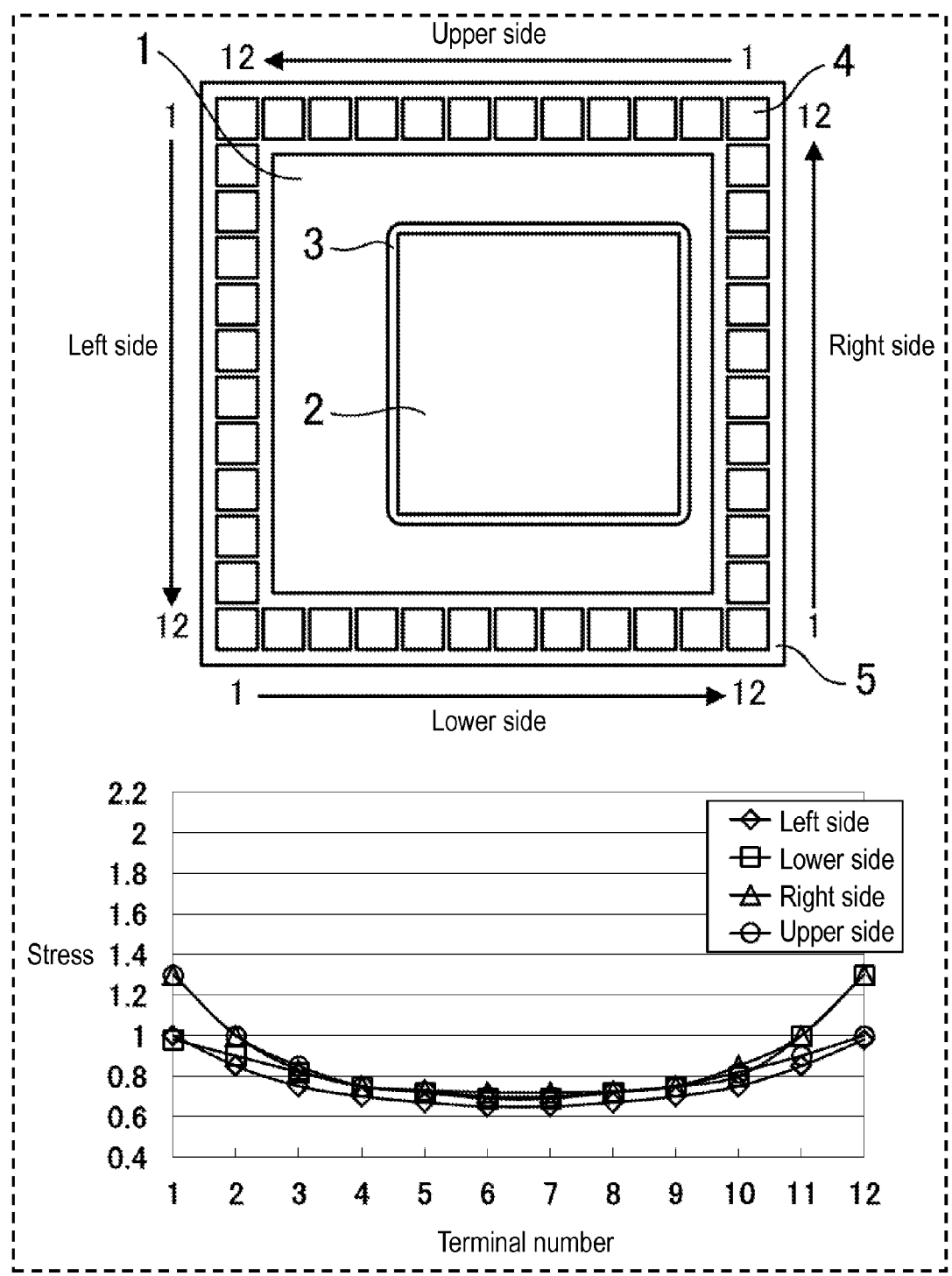
FIG. 6B is a diagram for explaining a simulation result of stress applied to a joint metal of a frame body illustrated in FIG. 5C.

FIGS. 6A and 6B are diagrams for explaining simulation results. FIG. 6A is a diagram for explaining a simulation result of stress applied to joint metal 7 of main substrate 1 illustrated in FIG. 5C, and FIG. 6B is a diagram for explaining a simulation result of stress applied to joint metal 10 of frame body 5 illustrated in FIG. 5C.

Upper stages of FIGS. 6A and 6B are diagrams in which numbers are indicated on the terminals of the connection parts (connection terminals 61 in FIG. 6A, and external terminals 4 in FIG. 6B). Numbers 1 to 12 are assigned to each of a left side, a lower side, a right side, and an upper side, in an order indicated by arrows. Further, two numbers are assigned to the first and the last terminal of each side. For example, number 1 on the left side and number 12 on the upper side indicate the same terminal. Then, in a graph at a lower stage, an abscissa indicates a number corresponding to a terminal of each side (joint metal 7 connected to connection terminal 61 in FIG. 6A, joint metal 10 connected to external terminal 4 in FIG. 6B), and an ordinate indicates stress applied to each joint metal 7 or each joint metal 10 when normalized by stress applied to a terminal of number 1 on the left side (joint metal 7 in FIG. 6A, joint metal 10 in FIG. 6B). In other words, in FIGS. 6A and 6B, the number assigned to connection terminal 61 corresponds to each joint metal 7, and the number assigned to external terminal 4 corresponds to each joint metal 10.

According to the graph at the lower stage in FIG. 6A, the simulation result of the stress applied to joint metal 7 indicates that a place where a stress value becomes maximum exists near a center of each side of main substrate 1. More specifically, it is considered that the stress value becomes maximum at a position facing a vicinity of a midpoint of the side included in semiconductor chip 2. Further, when the stresses of the respective sides are compared with each other, it is found that a difference between the right side where the maximum stress occurs and the left side where the minimum stress occurs is large.

According to the graph at the lower stage in FIG. 6B, the simulation result of the stress applied to joint metal 10 indicates that a place where a stress value becomes maximum exists near a corner of each side of frame body 5. It is found that the stress difference between the respective sides is small as compared with the graph at the lower stage in FIG. 6A. Further, when the stress applied to joint metal 7 and the stress applied to joint metal 10 are compared, it is found that regarding the maximum value of stress, the stress applied to joint metal 7 is larger than the stress applied to joint metal 10.

Figure 7:
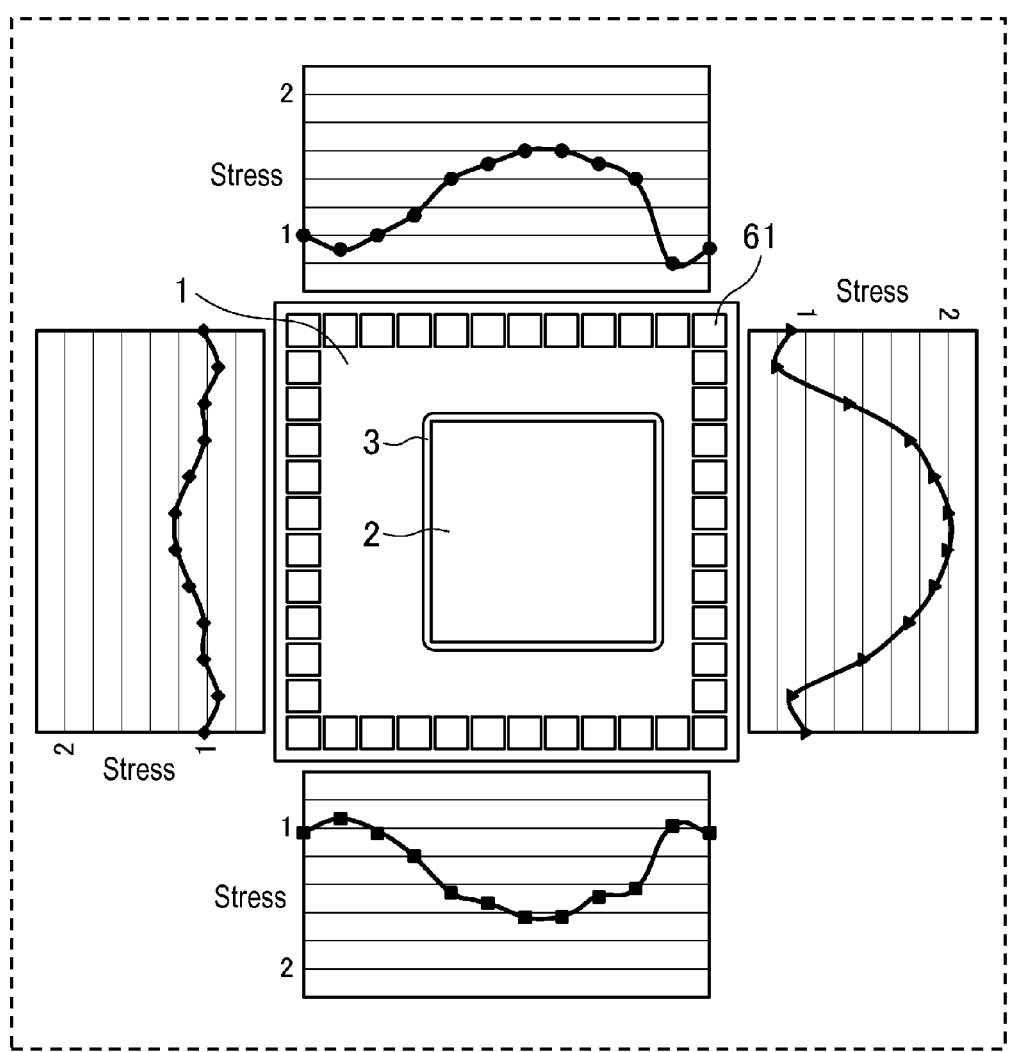
FIG. 7 is a diagram illustrating details of the simulation result.

FIG. 7 is a diagram for confirming the simulation result in detail. The graph of each side illustrated at the lower stage in FIG. 6A corresponds to each side of main substrate 1 at the upper stage in FIG. 6A. In FIG. 7, an ordinate indicates the stress applied to each joint metal 7 when normalized by stress applied to joint metal 7 of number 1 on the left side. As illustrated in FIG. 7, it is found that, the stress at the place, of each side of main substrate 1, facing the side of semiconductor chip 2 is increased. More specifically, it is considered that the stress value becomes maximum at the position of each side of main substrate 1 facing the vicinity of the midpoint of the side included in semiconductor chip 2. Further, it is found that the stress applied to joint metal 7 corresponding to the right side of the respective sides of main substrate 1 that is closest to semiconductor chip 2 is high. Furthermore, it is found that the stress applied to joint metal 7 corresponding to the center of the right side is highest. The reason for the rise in stress at the place facing the side of semiconductor chip 2 is that force generated when semiconductor chip 2 hinders shrinkage of main substrate 1 and underfill 3 is transmitted to joint metal 7. Main substrate 1 and underfill 3 both have large linear expansion coefficients, while semiconductor chip 2 is hard and has a small linear expansion coefficient. Accordingly, the stress at the connection part placed at the center of the right side that is closest to semiconductor chip 2 becomes high. Further, since an opposite side of the center of the side when viewed from the end is not hindered by semiconductor chip 2, the aforementioned force becomes small at an end of semiconductor chip 2, and force generated from the end of semiconductor chip 2 to the center of the side becomes large.

Therefore, as illustrated in FIGS. 1A to 1C, the areas of external terminal 4A, connection terminal 65A, connection terminal 61A, and joint metal 7A are respectively made larger than those of other external terminals 4, other connection terminals 65, other connection terminals 61, and other joint metals 7. Since the area of the connection part corresponding to the place at which the aforementioned force becomes large is increased, stress can be relaxed and reliability can be improved.

First Variation

Next, as a variation of the aforementioned exemplary embodiment, a case where semiconductor chip 2 is a rectangle will be described with reference to FIGS. 8A and 8B. Here, a difference from the case where semiconductor chip 2 is a square will be mainly described.

Figure 8A:
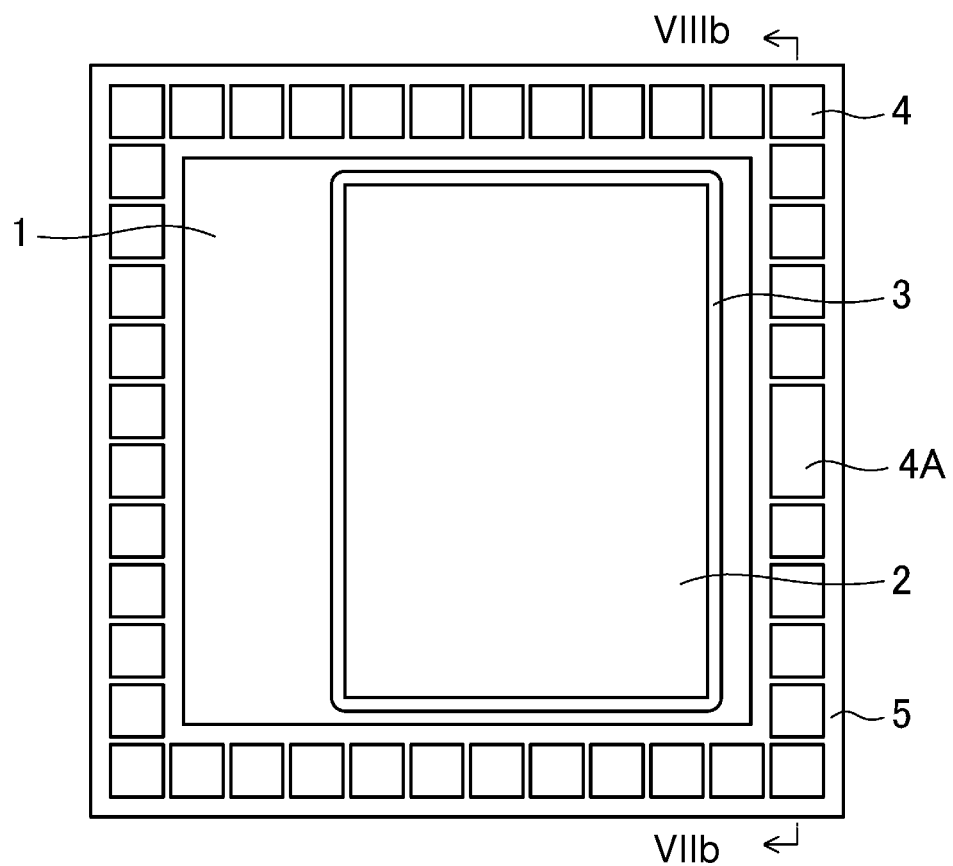
FIG. 8A is a plan view of an electronic component package according to a first variation.

FIG. 8A is a plan view of an electronic component package according to the first variation when viewed from an external terminal side. FIG. 8B is a sectional view between VIIIb-VIIIb in FIG. 8A.

External terminal 4A facing a side of long sides of semiconductor chip 2 that is closest to frame body 5 has an area larger than those of other external terminals 4. Connection terminal 65A facing external terminal 4A via frame body 5 has an area larger than those of other connection terminals 65. Connection terminal 61A facing connection terminal 65A has an area larger than those of other connection terminals 61. Joint metal 7A formed between connection terminal 65A and connection terminal 61A has an area larger than those of other joint metals 7. Although not illustrated in FIG. 8B, external terminals 4 are connected to substrate 9 via joint metals 10, and external terminal 4A is connected to substrate 9 via joint metal 10A (refer to FIG. 3).

Next, a result of simulation of stress applied to a connection part of another electronic component package will be described with reference to FIGS. 9A and 9B, the other electronic component package having rectangular semiconductor chip 2.

Figure 9A:
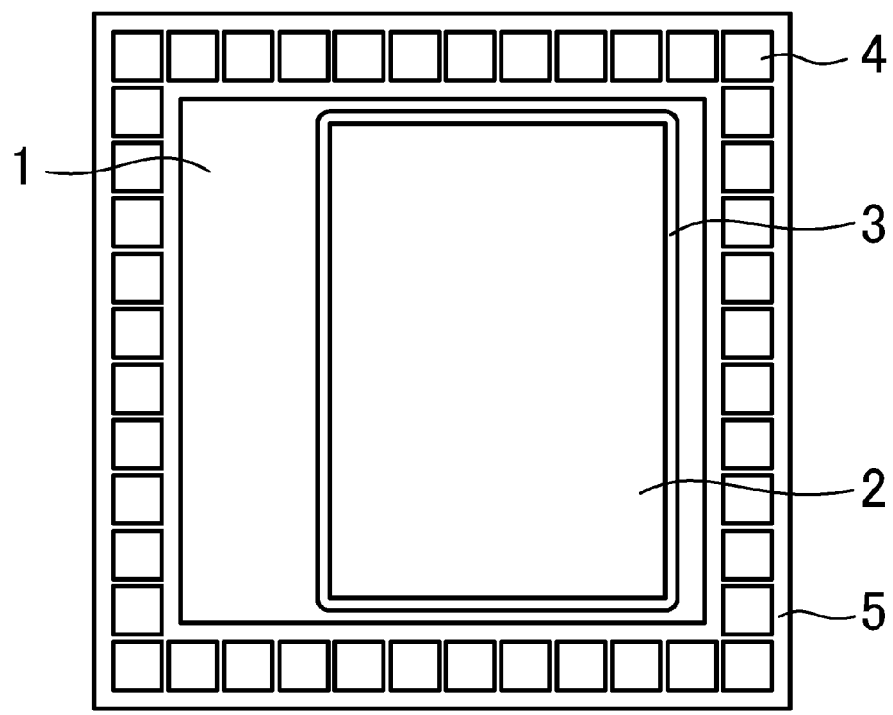
FIG. 9A is a plan view of an electronic component package used for simulation to compare with the electronic component package in FIGS. 8A and 8B.
Figure 9B:
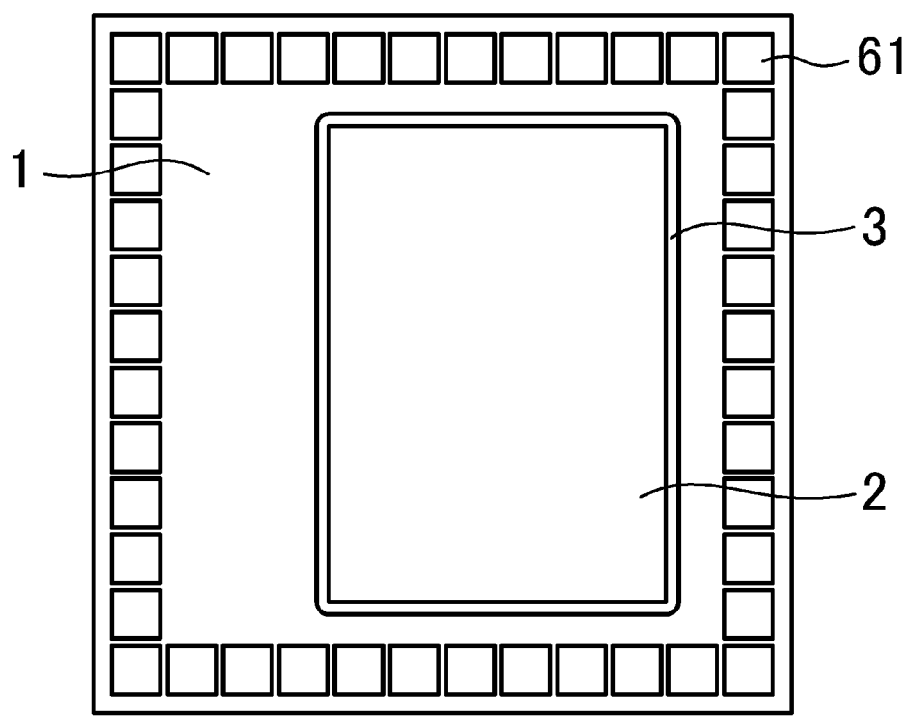
FIG. 9B is a plan view of an electronic component package where a frame body is omitted from FIG. 9A.

FIG. 9A is a plan view of the simulated electronic component package when viewed from an external terminal side, and FIG. 9B is a plan view of the electronic component package where frame body 5 is omitted from FIG. 9A.

In FIGS. 9A and 9B, a configuration of the electronic component package is different from that of the present variation in that external terminals 4, connection terminals 61 of main substrate 1, connection terminals 65 (not illustrated) of frame body 5, joint metals 7 (not illustrated) each formed between connection terminal 61 and connection terminal 65, and joint metals 10 (not illustrated) each connected to external terminal 4 respectively have the same sizes. Although not illustrated in the electronic component package in FIGS. 9A and 9B, joint metal 10 is connected to external terminal 4, and substrate 9 is connected to joint metal 10 (refer to FIG. 5C).

In the present variation, a graph of a simulation result corresponding to the lower stage in FIGS. 6A and 6B is omitted. However, even when semiconductor chip 2 is a rectangle, a maximum value of stress applied to joint metal 7 is large when stress applied to joint metal 7 and stress applied to joint metal 10 are compared.

Figure 10:
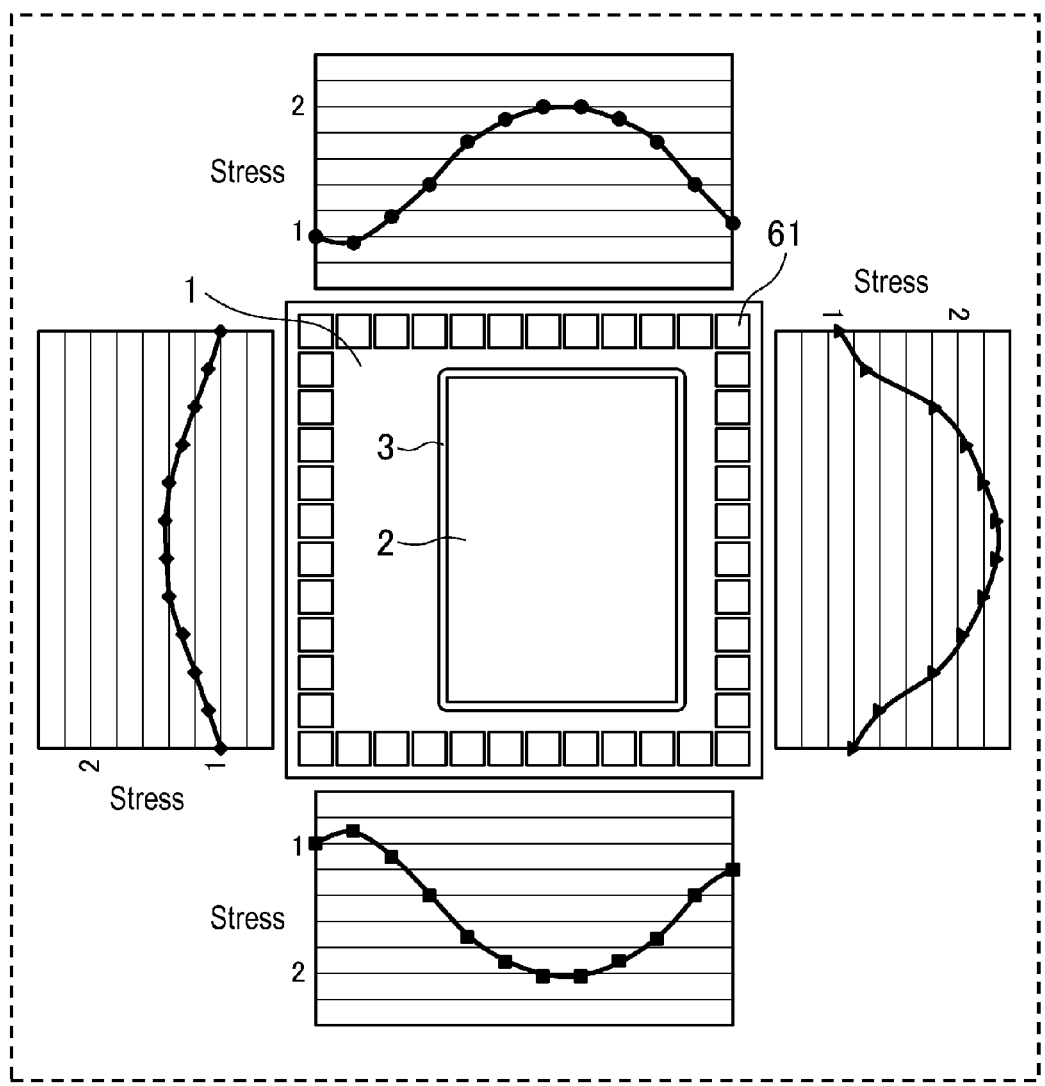
FIG. 10 is a diagram illustrating details of a simulation result using the electronic component package in FIGS. 9A and 9B.

FIG. 10 is a diagram for confirming this simulation result in detail. In FIG. 10, an ordinate indicates stress applied to each joint metal 7 when normalized by the stress applied to joint metal 7 of number 1 on a left side. In the graph corresponding to each side, it is found that the stress at a place corresponding to the side of semiconductor chip 2 is increased. Further, it is found that the stress applied to joint metal 7 corresponding to a right side that is closest to the long side of semiconductor chip 2 is high, and further, that the stress applied to joint metal 7 corresponding to a center of the side is highest. More specifically, a stress value is maximum at a position facing a vicinity of a midpoint of the side included in semiconductor chip 2 on a right side of main substrate 1. This is because a distance from an end of semiconductor chip 2 to a center on the long side of semiconductor chip 2 is longer than that on a short side of semiconductor chip 2.

Figure 8B:
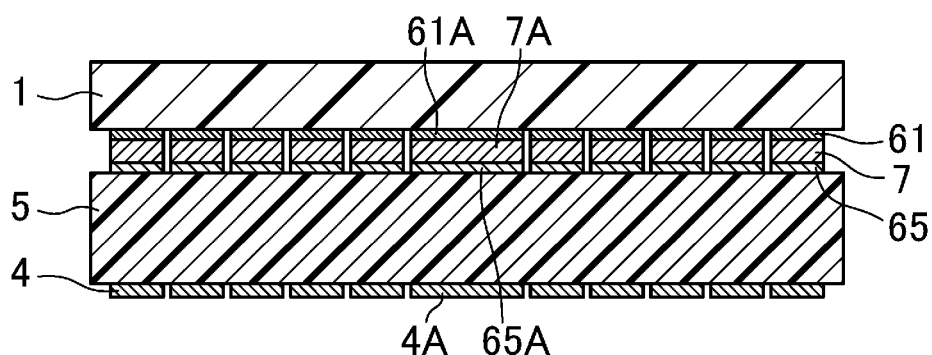
FIG. 8B is a sectional view between VIIIb-VIIIb in FIG. 8A.

Therefore, as illustrated in FIGS. 8A and 8B, an area of external terminal 4A at the center of the side of frame body 5 facing the long side of semiconductor chip 2 is larger than those of other external terminals 4. An area of connection terminal 65A facing external terminal 4A via frame body 5 is larger than those of other connection terminals 65. An area of connection terminal 61A facing connection terminal 65A is larger than those of other connection terminals 61. An area of joint metal 7A formed between connection terminals 61A and 65A is larger than those of other joint metals 7. Accordingly, since an area of the connection part corresponding to the place at which large force is generated is enlarged, stress can be relaxed and reliability can be improved.

In the first exemplary embodiment and the present variation, the area of the connection part near the center of the right side whose distance from semiconductor chip 2 is closest is enlarged to describe the most effective case. However, an area of a connection part on the right side whose distance from semiconductor chip 2 is relatively short may be enlarged. Further, an area of a connection part at each place facing the side of semiconductor chip 2 may be enlarged. The place of each side of main substrate 1 and frame body 5 facing the side of semiconductor chip 2 generates large force as compared with other places. Accordingly, when the area of the connection part at that place is enlarged, reliability of the electronic component package improves. The present disclosure includes a case of enlarging the area of this connection part.

Further, an area of at least one connection part may become large at the place, of the respective sides of main substrate 1 and frame body 5, facing the side of semiconductor chip 2. In other words, the present disclosure also includes a case where an area of the connection part at the place that does not face the side of semiconductor chip 2 is large Second Variation As another variation, a case where a plurality of semiconductor chips 2A and 2B is mounted will be described with reference to FIGS. 11A to 11C, 12A, and 12B. In the present variation, a difference from the case of one semiconductor chip will be mainly described.

Figure 11A:
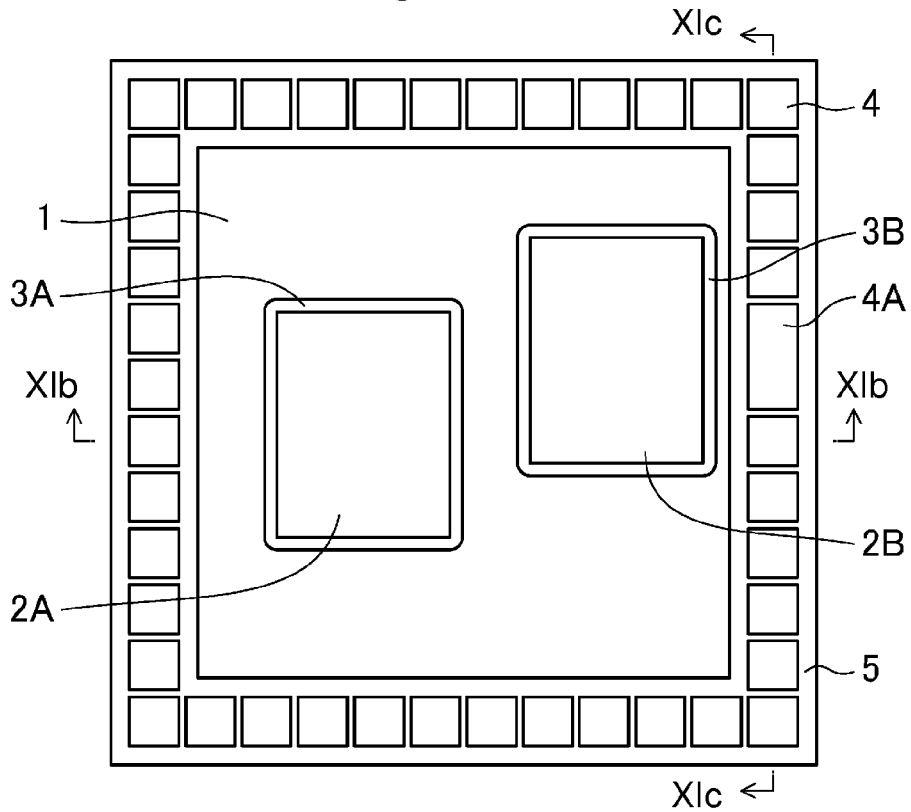
FIG. 11A is a plan view of an electronic component package according to a second variation.
Figure 11B:
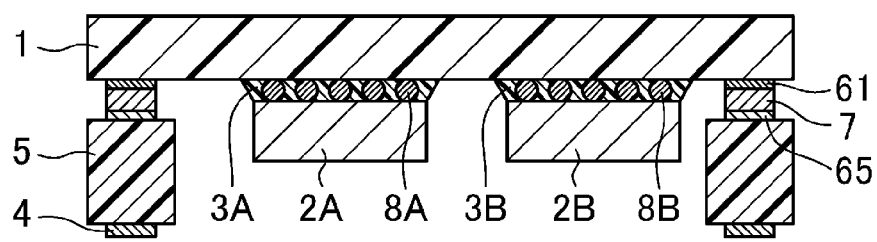
FIG. 11B is a sectional view between XIb-XIb in FIG. 11A.
Figure 11C:
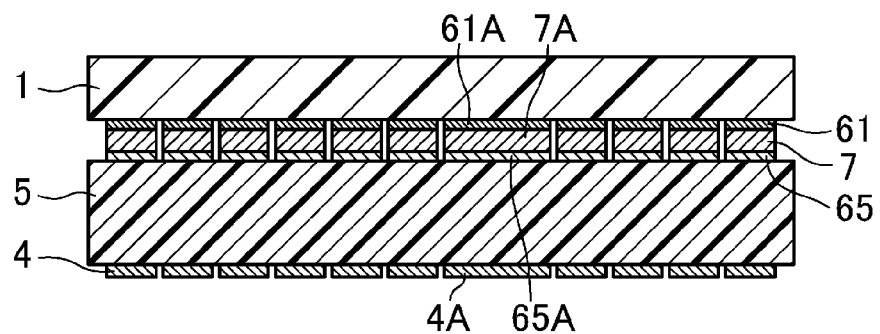
FIG. 11C is a sectional view between XIc-XIc in FIG. 11A.

FIG. 11A is a plan view of an electronic component package according to the present variation when viewed from an external terminal side. FIG. 11B is a sectional view between XIb-XIb—in FIG. 11A, and FIG. 11C is a sectional view between XIc-XIc in FIG. 11A.

Semiconductor chip 2A is mounted on main substrate 1 via joint metal 8A, and semiconductor chip 2B is mounted on main substrate 1 via joint metal 8B. Underfill 3A is injected between main substrate 1 and semiconductor chip 2A, and underfill 3B is injected between main substrate 1 and semiconductor chip 2B. Semiconductor chip 2B is disposed at a position closer to frame body 5 than semiconductor chip 2A.

Further, in the electronic component package according to the present variation, external terminal 4A of frame body 5 facing semiconductor chip 2B has an area larger than those of other external terminals 4. Connection terminal 65A facing external terminal 4A via frame body 5 has an area larger than those of other connection terminals 65. Connection terminal 61A facing connection terminal 65A has an area larger than those of other connection terminals 61. Joint metal 7A formed between connection terminal 65A and connection terminal 61A has an area larger than those of other joint metals 7.

Next, a result of simulation of stress applied to a connection part of another electronic component package, on which the plurality of semiconductor chips 2A and 2B is mounted, will be described with reference to FIGS. 12A and 12B.

Figure 12A:
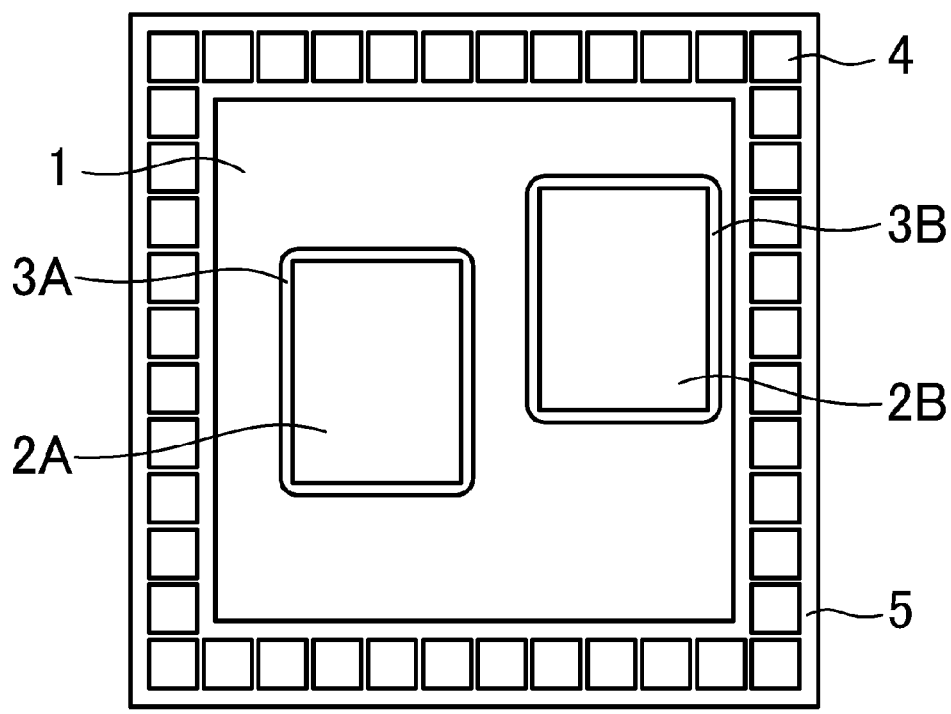
FIG. 12A is a plan view of an electronic component package used for simulation to compare with the electronic component package in FIGS. 11A to 11C.
Figure 12B:
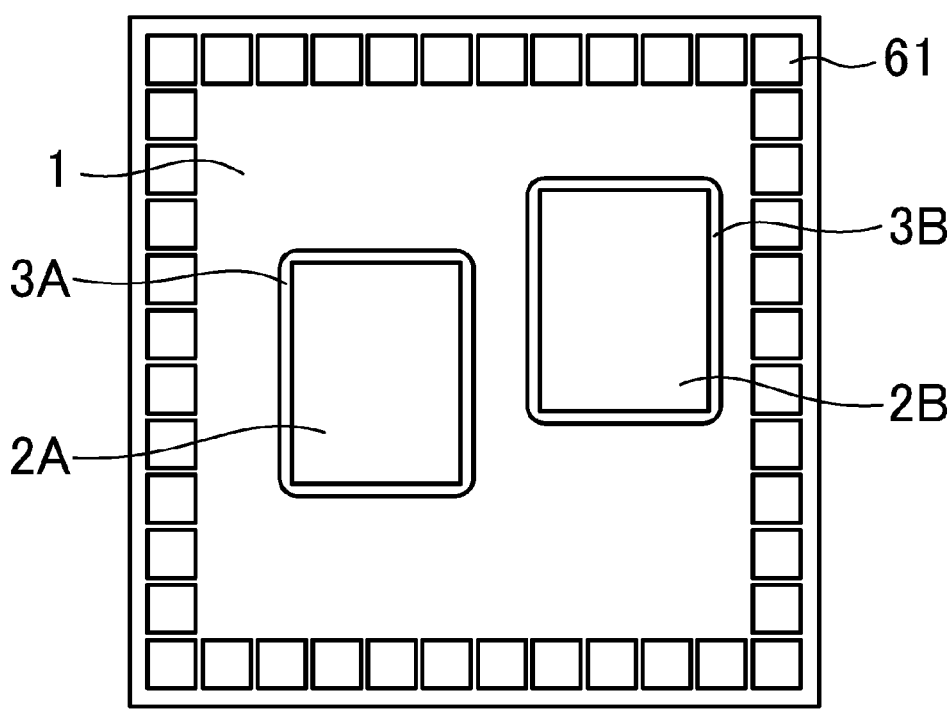
FIG. 12B is a plan view of an electronic component package where a frame body is omitted from FIG. 12A.

FIG. 12A is a plan view of the simulated electronic component package when viewed from an external terminal side, and FIG. 12B is a plan view of the electronic component package where frame body 5 is omitted from FIG. 12A.

In FIGS. 12A and 12B, a configuration of the electronic component package is different from that of the present variation in that external terminals 4, connection terminals 61 of main substrate 1, connection terminals 65 (not illustrated) of frame body 5, joint metals 7 (not illustrated) each formed between connection terminal 61 and connection terminal 65, and joint metals 10 (not illustrated) each connected to external terminal 4 respectively have the same sizes. Although not illustrated in the electronic component package in FIGS. 12A and 12B, joint metal 10 is connected to external terminal 4, and substrate 9 is connected to joint metal 10 (refer to FIG. 5C).

In the present variation, a graph of a simulation result corresponding to the lower stage in FIGS. 6A and 6B is omitted. However, even when the plurality of semiconductor chips 2A, 2B is mounted, a maximum value of stress applied to joint metal 7 is large when stress applied to joint metal 7 and stress applied to joint metal 10 are compared.

Figure 13:
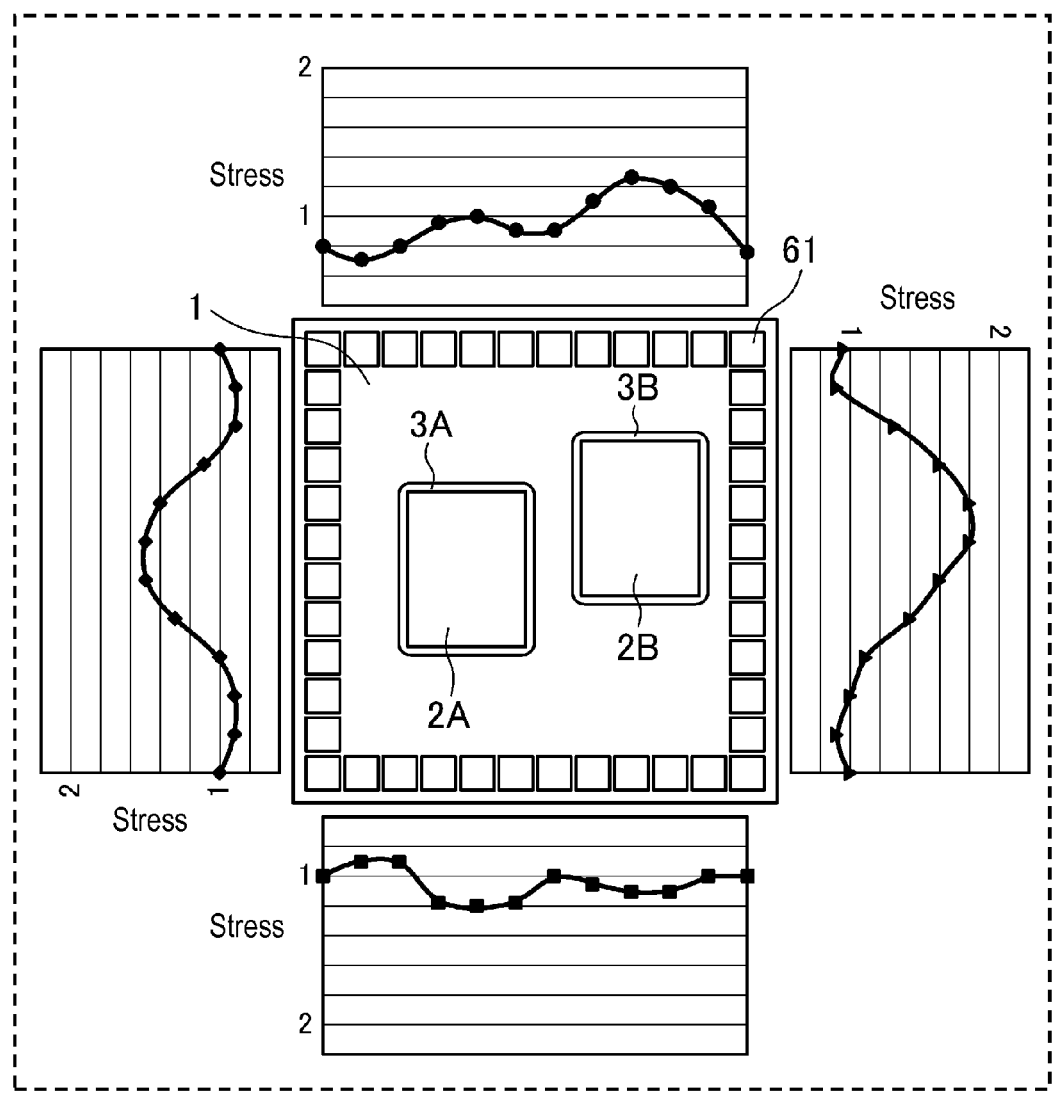
FIG. 13 is a diagram illustrating details of a simulation result using the electronic component package in FIG. 12B.

FIG. 13 is a diagram for confirming this simulation result in detail. In FIG. 13, an ordinate indicates stress applied to each joint metal 7 when normalized by the stress applied to joint metal 7 of number 1 on a left side. In the graph corresponding to each side, it is found that the stress increases at a place corresponding to the side of semiconductor chip 2A or 2B.

Further, the stress on joint metal 7 corresponding to a right side that is closest to semiconductor chip 2B is high, and particularly, the stress on joint metal 7 at a place corresponding to semiconductor chip 2B is highest.

Therefore, as illustrated in FIGS. 11A to 11C, on the side, of the sides of frame body 5, whose distance from semiconductor chip 2B is the shortest, stress applied to a place facing semiconductor chip 2B can be relaxed and reliability of the electronic component package can be improved by enlarging an area of a connection part at that place. More specifically, it is preferable to enlarge, on a right side of main substrate 1, the area of the connection part that exists at a position facing a vicinity of a midpoint of the side included in semiconductor chip 2B.

In the present variation, as illustrated in FIGS. 11A to 11C, the area of the connection part near the center of the right side, of the sides of frame body 5, whose distance from semiconductor chip 2B is the shortest is enlarged to describe the most effective case. Other than this, an area of a connection part on the side of frame body 5 facing a side, of the sides of semiconductor chip 2B, which is closer to frame body 5 than semiconductor chip 2A may be enlarged. Since force generated at this connection part is large as compared with the other places, reliability of the electronic component package improves when the area of the connection part is enlarged. The present disclosure includes a case of enlarging the area of this connection part.

Third Variation

As a further variation, a case where a plurality of semiconductor chips 2A, 2B with different areas is mounted will be described with reference to FIGS. 14A to 16. Here, a difference from the second variation will be mainly described.

Figure 14A:
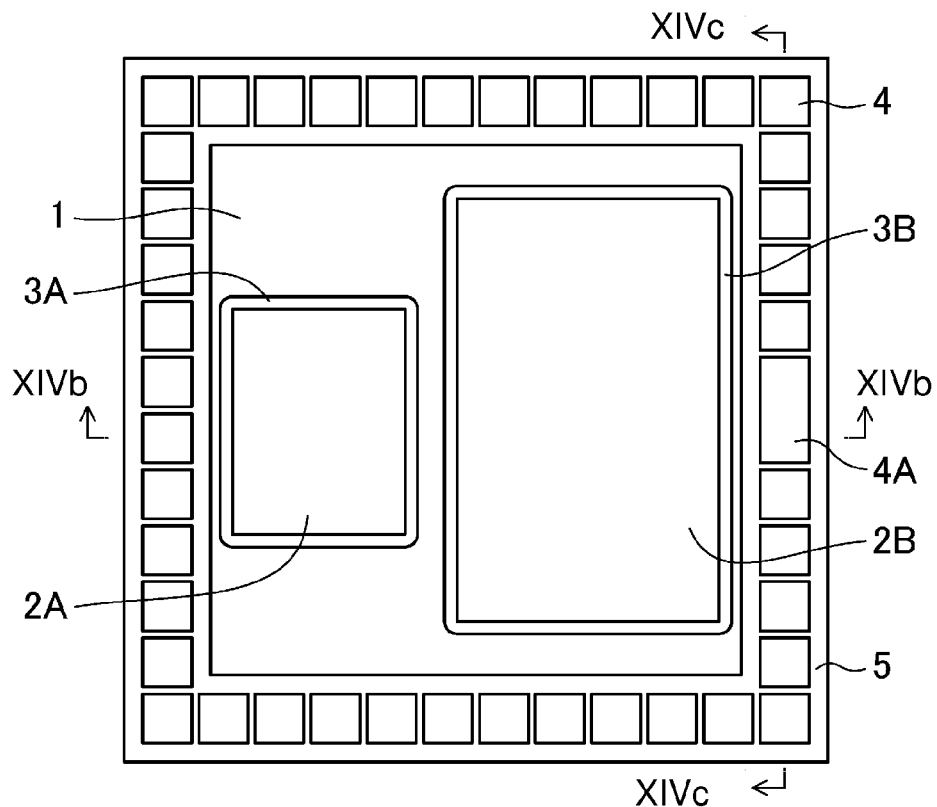
FIG. 14A is a plan view of an electronic component package according to a third variation.
Figure 14B:
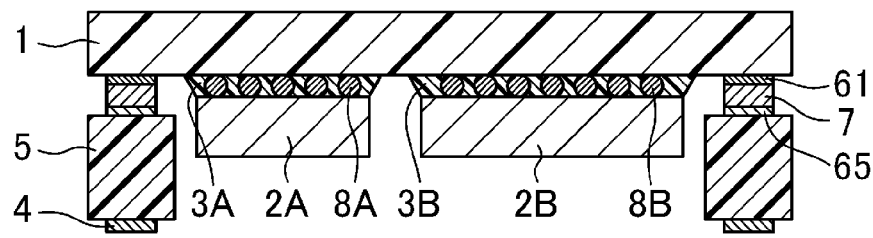
FIG. 14B is a sectional view between XIVb-XIVb in FIG. 14A.
Figure 14C:
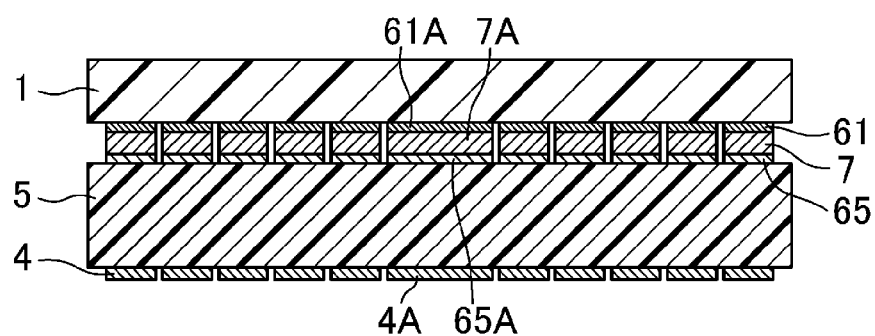
FIG. 14C is a sectional view between XIVc-XIVc in FIG. 14A.

FIG. 14A is a plan view of an electronic component package according to the present variation when viewed from an external terminal side. FIG. 14B is a sectional view between XIVb-XIVb in FIG. 14A, and FIG. 14C is a sectional view between XIVc-XIVc in FIG. 14A.

In the electronic component package according to the present variation, an area of semiconductor chip 2B is larger than that of semiconductor chip 2A. Moreover, external terminal 4A of frame body 5 facing semiconductor chip 2B with a large area has an area larger than those of other external terminals 4. Connection terminal 65A facing external terminal 4A via frame body 5 has an area larger than those of other connection terminals 65. Connection terminal 61A facing connection terminal 65A has an area larger than those of other connection terminals 61. Joint metal 7A formed between connection terminal 65A and connection terminal 61A has an area larger than those of other joint metals 7.

Next, a result of simulation of stress applied to a connection part of another electronic component package, on which a plurality of semiconductor chips 2A and 2B with different areas is mounted, will be described with reference to FIGS. 15A, 15B and 16.

Figure 15A:
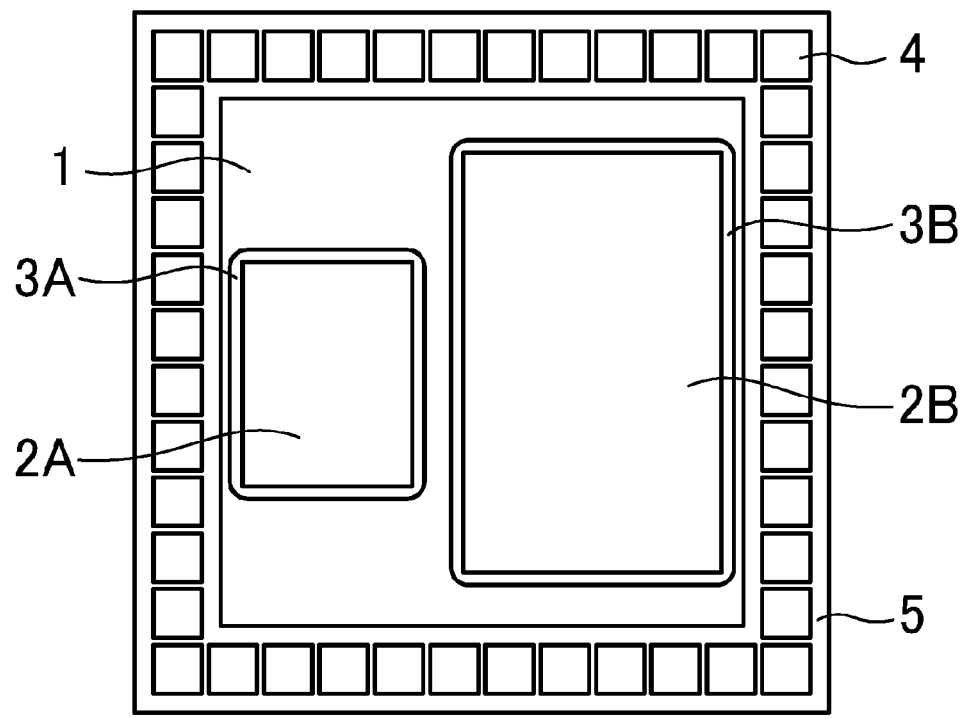
FIG. 15A is a plan view of an electronic component package used for simulation to compare with the electronic component package in FIGS. 14A to 14C.
Figure 15B:
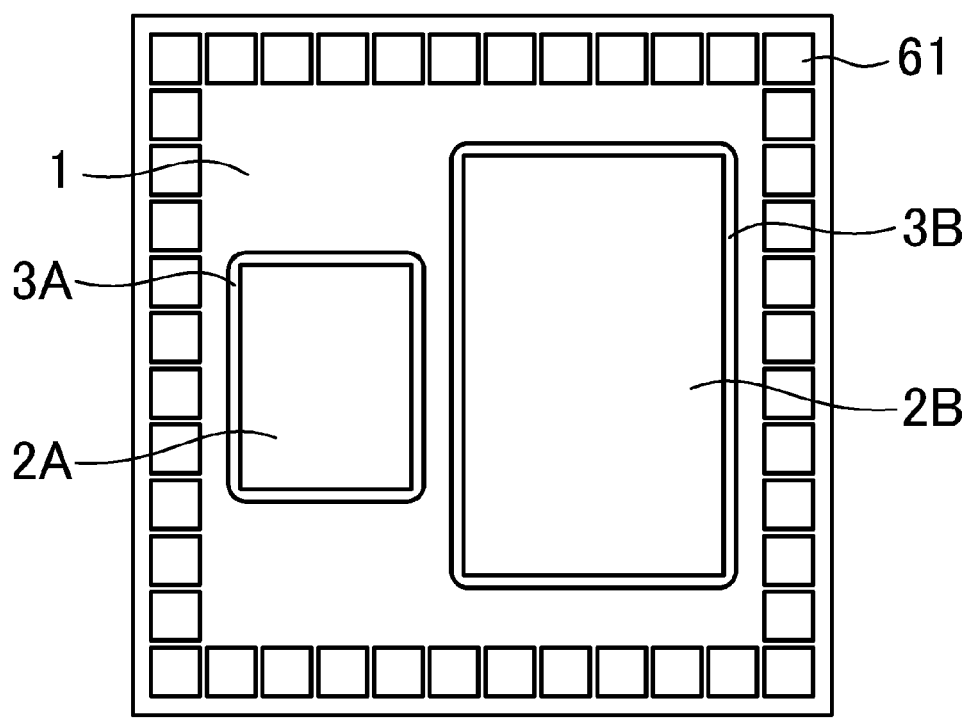
FIG. 15B is a plan view of an electronic component package where a frame body is omitted from FIG. 15A.

FIG. 15A is a plan view of the simulated electronic component package when viewed from an external terminal side, and FIG. 15B is a plan view of the electronic component package where frame body 5 is omitted from FIG. 15A.

In FIGS. 15A and 15B, a configuration of the electronic component package is different from that of the present variation in that external terminals 4, connection terminals 61 of main substrate 1, connection terminals 65 (not illustrated) of frame body 5, joint metals 7 (not illustrated) each formed between connection terminal 61 and connection terminal 65, and joint metals 10 (not illustrated) each connected to external terminal 4 respectively have the same sizes. Although not illustrated in the electronic component package in FIGS. 15A and 15B, joint metal 10 is connected to external terminal 4, and substrate 9 is connected to joint metal 10 (refer to FIG. 5C).

In the present variation as well, in the same manner as the second variation, a maximum value of stress applied to joint metal 7 is large when stress applied to joint metal 7 and stress applied to joint metal 10 are compared.

Figure 16:
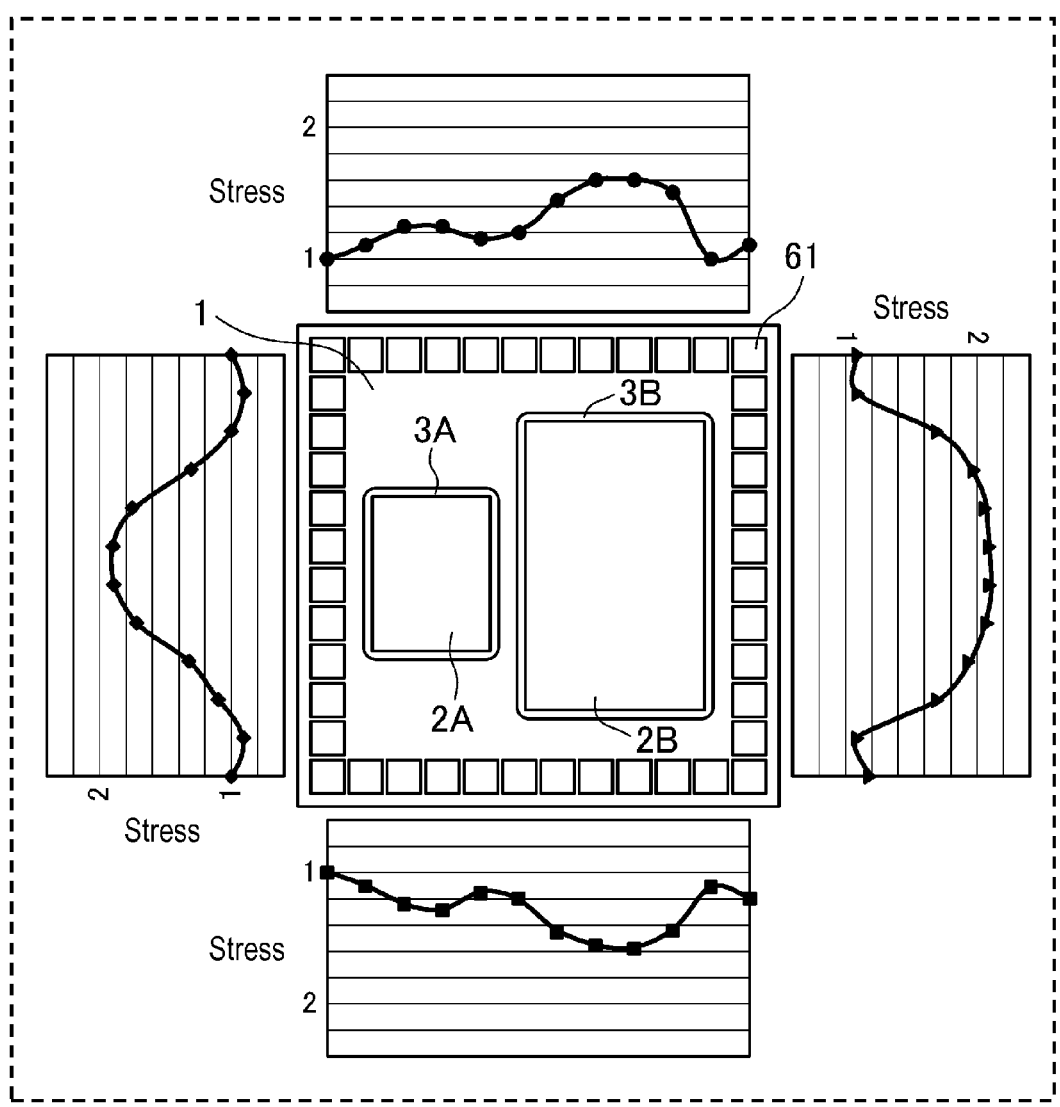
FIG. 16 is a diagram illustrating details of a simulation result using the electronic component package in FIGS. 15A and 15B.

FIG. 16 is a diagram for confirming the simulation result in detail. An ordinate indicates the same as in FIG. 13. As illustrated in FIG. 16, in the graph corresponding to each side, it is found that the stress increases at a place corresponding to the side of semiconductor chip 2A or 2B. Further, the stress on joint metal 7 corresponding to a right side is high. The right side faces a side which is a long side of semiconductor chip 2B with a large area and is close to frame body 5. Particularly, the stress of joint metal 7 corresponding to a center of the right side is highest.

Therefore, as illustrated in FIGS. 14A to 14C, on the side, of the sides of frame body 5, whose distance from semiconductor chip 2B is the shortest, stress applied to a place corresponding to semiconductor chip 2B can be relaxed and reliability can be improved by enlarging an area of a connection part at that place. More specifically, on the right side of frame body 5, the area of the connection part that exists at a position facing a vicinity of a midpoint of the side included in semiconductor chip 2B may be enlarged.

In the present variation, as illustrated in FIGS. 14A to 14C, the area of the connection part near the center of the right side, of the sides of frame body 5, whose distance from semiconductor chip 2B is the shortest is enlarged to describe the most effective case. Other than this, an area of a connection part on the side of frame body 5 facing a side, of the sides of semiconductor chip 2B, that is longer than the side of semiconductor chip 2A and is close to frame body 5 may be enlarged. Since force generated at this connection part is large as compared with the other places, reliability of the electronic component package improves when the area of the connection part is enlarged. The present disclosure includes a case of enlarging the area of this connection part.

Further, in the second and third variations, the area of at least one connection part at the place facing the side of semiconductor chip 2B may become larger than those of other connection parts. In other words, the present disclosure also includes a case where an area of the connection part at the place that does not face the side of semiconductor chip 2B is large.

Further, in the second and third variations, the present disclosure also includes a case where three or more semiconductor chips are mounted as the plurality of semiconductor chips.

Further, in the third variation, when areas of the plurality of semiconductor chips are respectively different and distances between the plurality of semiconductor chips and frame body 5 are respectively different, an area of the connection part at any place may be enlarged depending on a difference in areas or distances. For example, there is a case where an area of a connection part at a place corresponding to a side of a semiconductor chip having a long distance and a large area is large, or a case where an area of a connection part at a place corresponding to a side of a semiconductor chip having a short distance and a small area is large. The present disclosure also includes these cases.

Fourth Variation

Figure 17A:
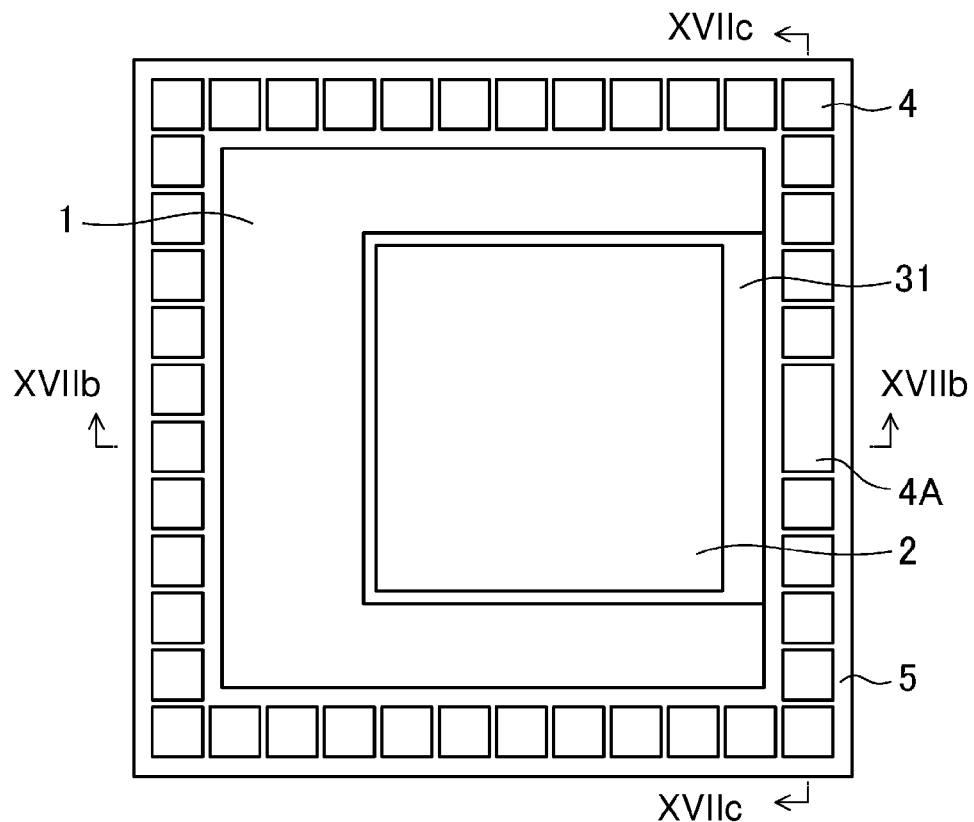
FIG. 17A is a plan view of an electronic component package according to a fourth variation.
Figure 17B:
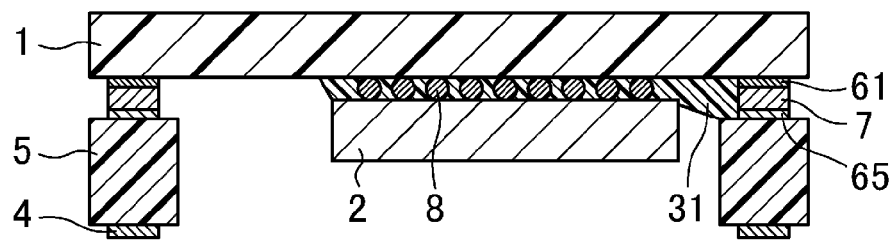
FIG. 17B is a sectional view between XVIIb-XVIIb in FIG. 17A.
Figure 17C:
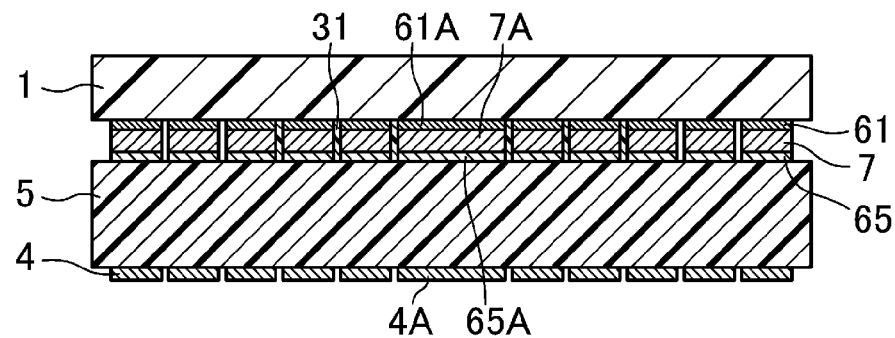
FIG. 17C is a sectional view between XVIIc-XVIIc in FIG. 17A.

FIG. 17A is a schematic view illustrating a plane of an electronic component package according to a fourth variation, and FIGS. 17B and 17C are schematic views illustrating sections of the electronic component package according to the fourth variation. In FIG. 17A, a shape of semiconductor chip 2 is a square. However, the shape of semiconductor chip 2 may be a rectangle. In the present variation, a difference from FIG. 1A will be mainly described.

FIG. 17A is a plan view of the electronic component package according to the present variation when viewed from an external terminal side. FIG. 17B is a sectional view between XVIIb-XVIIb in FIG. 17A, and FIG. 17C is a sectional view between XVIIc-XVIIc in FIG. 17A.

Semiconductor chip 2 is mounted on main substrate 1 via joint metal 8. Further, external terminal 4A has an area larger than those of other external terminals 4. Connection terminal 65A facing external terminal 4A via frame body 5 has an area larger than those of other connection terminals 65. Connection terminal 61A facing connection terminal 65A has an area larger than those of other connection terminals 61. Joint metal 7A formed between connection terminal 65A and connection terminal 61A has an area larger than those of other joint metals 7. Moreover, underfill 31 is injected from between main substrate 1 and semiconductor chip 2A to between an area including connection terminal 61A of main substrate 1 and an area including connection terminal 65A of frame body 5.

In this way, in the present variation, an area of a connection part is enlarged. Since underfill 31 is injected into a range including connection terminal 61A, connection terminal 65A, and joint terminal 7A, it is possible to reinforce the connection part to which particularly large stress is applied. Therefore, reliability of the electronic component package can be further improved. Further, since underfill 31 between main substrate 1 and semiconductor chip 2 and underfill 31 between the area including connection terminal 61A of main substrate 1 and the area including connection terminal 65A of frame body 5 are the same, underfill 31 can be formed collectively. Cost can be reduced more than a case where these underfills 31 are formed separately.

The present disclosure also includes a case where underfill 31 is injected into an entire side between frame body 5 and main substrate 1 including the connection part with a large area.

Further, it is not necessary that underfill 31 is continuous from between main substrate 1 and semiconductor chip 2 to between the area including connection terminal 61A of main substrate 1 and the area including connection terminal 65A of frame body 5. Since it is effective as long as underfill 31 is injected into at least a part of the area between main substrate 1 and frame body 5, the present disclosure includes this case.

Further, the present disclosure includes a case where underfill 31 between main substrate 1 and semiconductor chip 2 and underfill 31 between the area including connection terminal 61A of main substrate 1 and the area including connection terminal 65A of frame body 5 are formed of different resins.

Second Exemplary Embodiment

Figure 18:
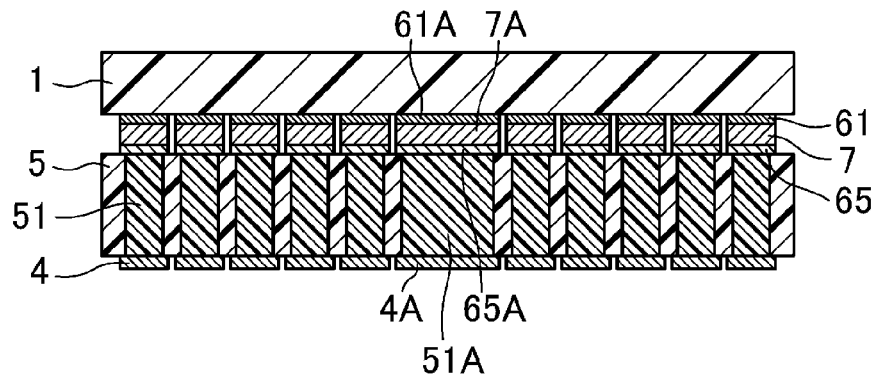
FIG. 18 is a schematic view illustrating a section of an electronic component package according to a second exemplary embodiment.

FIG. 18 is a schematic view illustrating a section of an electronic component package according to a second exemplary embodiment. In the electronic component package according to the present exemplary embodiment, external terminal 4A of frame body 5 has an area larger than those of other external terminals 4. Connection terminal 65A facing external terminal 4A via frame body 5 has an area larger than those of other connection terminals 65. Connection terminal 61A of main substrate 1 facing connection terminal 65A has an area larger than those of other connection terminals 61. Joint metal 7A formed between connection terminal 61A and connection terminal 65A has an area larger than those of other joint metals 7. In other words, FIG. 18 is sectional view of a place where the areas of these connection parts are enlarged.

External terminal 4 and connection terminal 65 corresponding to external terminal 4 are connected by wiring line 51 provided inside frame body 5. On the other hand, external terminal 4 and connection terminal 65A are provided inside frame body 5 and connected by wiring line 51A which is thicker than wiring line 51.

Although not illustrated, connection terminal 61 is a dummy terminal or connected to a ground part.

The areas of connection terminal 61A, connection terminal 65A, joint metal 7A, and external terminal 4A are enlarged to relax stress. However, even when the stress is relaxed, there is a possibility that a malfunction occurs at that place. When connection terminal 61A is the dummy terminal, a problem does not occur in electrical properties even when a malfunction occurs. Accordingly, reliability of the electronic component package improves.

Further, when the connection part having an enlarged area is connected to the ground part, a plurality of terminals is connected to the ground part. Accordingly, an influence of damage received by the connection part can be made small, and reliability of the electronic component package improves.

Further, connection terminal 65A and external terminal 4A can be connected by thick wiring line 51A by enlarging the area of external terminal 4A. As a result, the ground can be reinforced when connection terminal 61A is connected to the ground part, and a signal can be reinforced when connection terminal 61A is connected to a signal wiring line.

It is not necessary that wiring lines 51, 51A are disposed on the same section. Wiring line 51 may connect connection terminal 61 and external terminal 4, and wiring line 51A may connect the connection terminal having an enlarged area and the external terminal having an enlarged area. The present disclosure also includes this case.

Further, the present disclosure also includes a case where connection terminal 65 and external terminal 4 are connected to terminals other than mutually corresponding terminals.

Third Exemplary Embodiment

Figure 19:
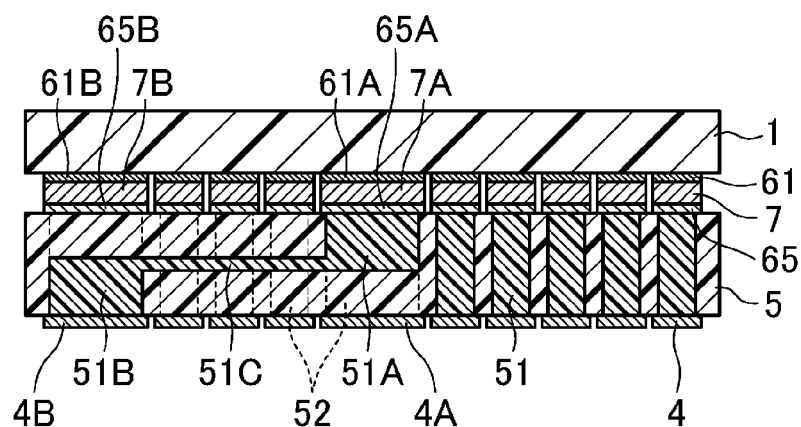
FIG. 19 is a schematic view illustrating a section of an electronic component package according to a third exemplary embodiment.

FIG. 19 is a schematic view illustrating a section of an electronic component package according to a third exemplary embodiment. In the present exemplary embodiment, a difference from the second exemplary embodiment will be mainly described.

As illustrated in FIG. 19, in the electronic component package according to the present exemplary embodiment, connection terminal 61B provided at a corner of main substrate 1 has an area larger than those of other connection terminals 61. Connection terminal 65B that faces connection terminal 61B and is provided at a corner of frame body 5 has an area larger than those of other connection terminals 65. Joint metal 7B formed between connection terminal 61B and connection terminal 65B has an area larger than those of other joint metals 7. External terminal 4A facing connection terminal 65B via frame body 5 has an area larger than those of other external terminals 4.

Wiring line 52 within frame body 5 is formed at a position different from a section illustrated in FIG. 18 and connects connection terminal 65 and external terminal 4. Connection terminal 65A and external terminal 4B are connected via wiring lines 51A, 51B, 51C. Although partially omitted in FIG. 19, connection terminal 65B is connected to external terminal 4A.

Since large force is generated at external terminal 4 located at the corner of frame body 5, a defect easily occurs at external terminal 4 even when the area of this external terminal 4 is enlarged. On the other hand, even when an area of a connection part at the place corresponding to a side of a semiconductor chip is enlarged, the defect easily occurs between frame body 5 and main substrate 1. Therefore, by connecting connection terminal 65A and external terminal 4B which are at the place where the defect easily occurs, a combination of the connection terminal and the external terminal where the defect easily occurs can be decreased as compared with a case where connection terminal 65A is connected to other external terminal 4 and external terminal 4B is connected to other connection terminal 65. The terminal of the combination where the defect easily occurs is connected to a dummy terminal or a ground part when the terminal has a high possibility of generating the defect. Accordingly, since the combination of the connection terminal and the external terminal where the defect easily occurs is decreased, a combination of the connection terminal and the external terminal capable of using any signal line or the like can be increased.

The present disclosure also includes a case where the areas of external terminal 4B, connection terminal 65B, connection terminal 61B, and joint metal 7B are respectively the same as those of other external terminals 4, other connection terminals 65, other connection terminals 61, and other joint metals 7.

Further, the present disclosure also includes a case where connection terminal 65B is not connected to external terminal 4A when connection terminal 65B is connected to an external terminal other than external terminal 4A and external terminal 4A is connected to a connection terminal other than connection terminal 65B.

Further, wiring lines 51, 51A, 51B, 51C, 52 within frame body 5 may be connected as mentioned above. The present disclosure also includes a case where the wiring lines do not exist on the same section.

Further, the present disclosure also includes a case where connection terminal 65 and external terminal 4 are respectively connected to terminals other than mutually corresponding terminals.

Fourth Exemplary Embodiment

Figure 20:
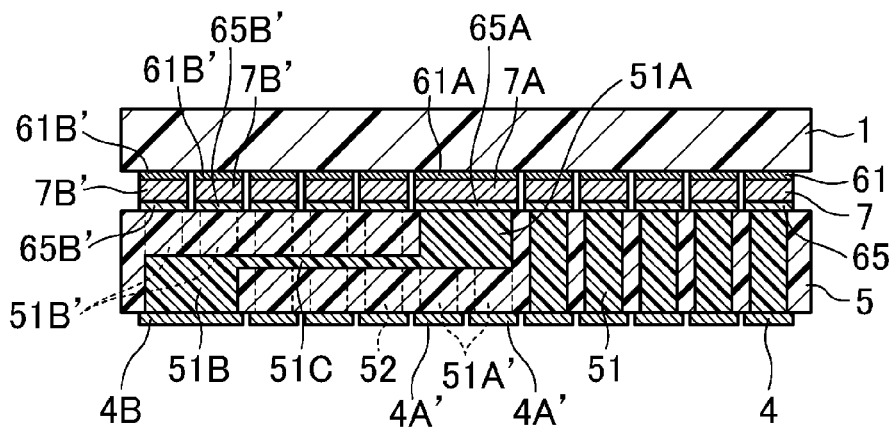
FIG. 20 is a schematic view illustrating a section of an electronic component package according to a fourth exemplary embodiment.

FIG. 20 is a schematic view illustrating a section of an electronic component package according to a fourth exemplary embodiment. In the present exemplary embodiment, a difference from the third exemplary embodiment will be mainly described.

As illustrated in FIG. 20, in the electronic component package according to the present exemplary embodiment, an area of external terminal 4B provided at a corner of frame body 5 is larger than those of other external terminals 4. Further, a pair of connection terminals 61B' provided at a corner of main substrate 1 has the same area as other connection terminals 61. A pair of connection terminals 65B' that faces connection terminal 61B' and is provided at the corner of frame body 5 has the same area as other connection terminals 65. A pair of external terminals 4A' facing connection terminal 65A via frame body 5 has the same area as other connection terminals 4.

External terminal 4 and connection terminal 65 are connected by wiring line 51 within frame body 5. Wiring lines 52, 51A', 51B' within frame body 5 are formed at positions different from a section illustrated in FIG. 20.

Connection terminal 65A and external terminal 4B are connected via wiring lines 51A, 51B, 51C. Further, though partially omitted in the drawing, connection terminal 65B' is connected to external terminal 4A'.

Force applied to a connection part at a place corresponding to a side of a semiconductor chip between frame body 5 and main substrate 1, and force applied to external terminal 4B located at the corner of frame body 5 are large. However, the force applied to this connection part is not larger than force applied to connection parts at other places between frame body 5 and main substrate 1, and the force applied to external terminal 4B is not larger than force applied to other external terminals 4. Therefore, the areas of the connection parts at the other places between frame body 5 and main substrate 1 may be made equal, and the areas of other external terminals 4 may be made equal. In this case, a number of usable terminals can be increased while lowering a possibility of generating a malfunction at the terminal and maintaining high reliability.

Description has been given of a case where two external terminals 4A' and two connection terminals 65B' are provided. However, the present disclosure also includes a case where three or more external and connection terminals are provided.

Further, the present disclosure also includes a case where connection terminal 65B' is connected to an external terminal other than external terminal 4A' and external terminal 4B is connected to a connection terminal other than connection terminal 65A.

Further, wiring lines 51, 51A, 51B, 51C, 51A', 51B', 52 within frame body 5 may be connected as mentioned above. The present disclosure also includes a case where wiring lines do not exist on the same section.

Further, the present disclosure also includes a case where connection terminal 65 and external terminal 4 are respectively connected to terminals other than mutually corresponding terminals.

In the aforementioned exemplary embodiments and variations, for example, as illustrated in FIGS. 2A and 2B, description has been given of a case where the side of connection terminal 61A of main substrate 1 in the direction parallel to the side facing semiconductor chip 2 (i.e., the side in the direction parallel to first side 62) is longer than those of other connection terminals 61. However, a side in a direction perpendicular to the side facing semiconductor chip 2 may be longer than those of other connection terminals 61. This case will be described below.

Figure 21A:
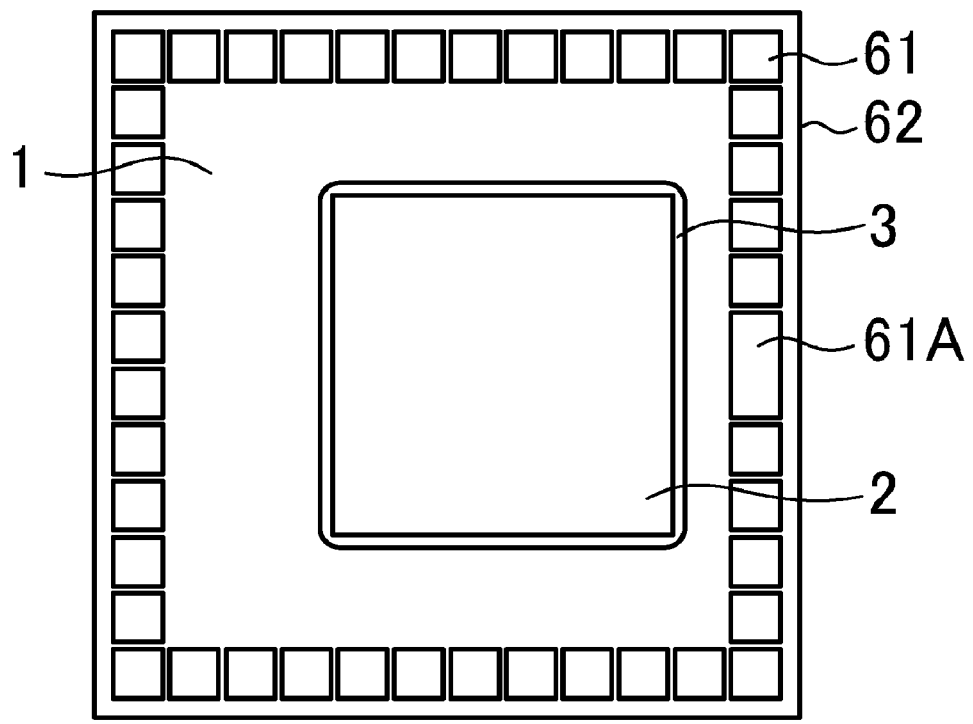
FIG. 21A is a plan view of the electronic component package according to the first exemplary embodiment.
Figure 21B:
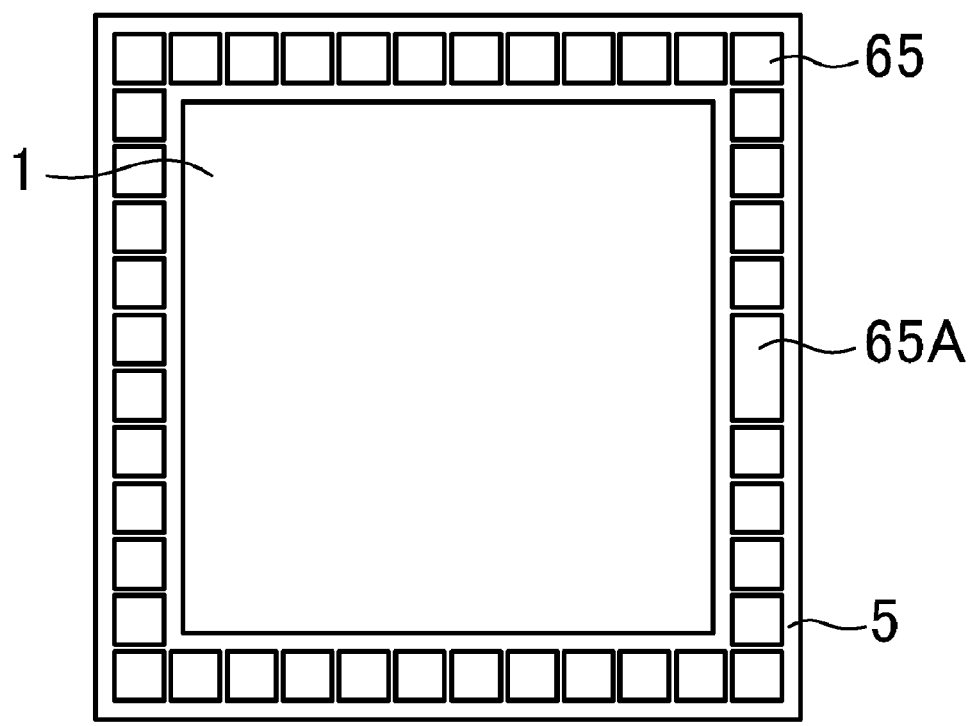
FIG. 21B is a plan view of the electronic component package according to the first exemplary embodiment.
Figure 21C:
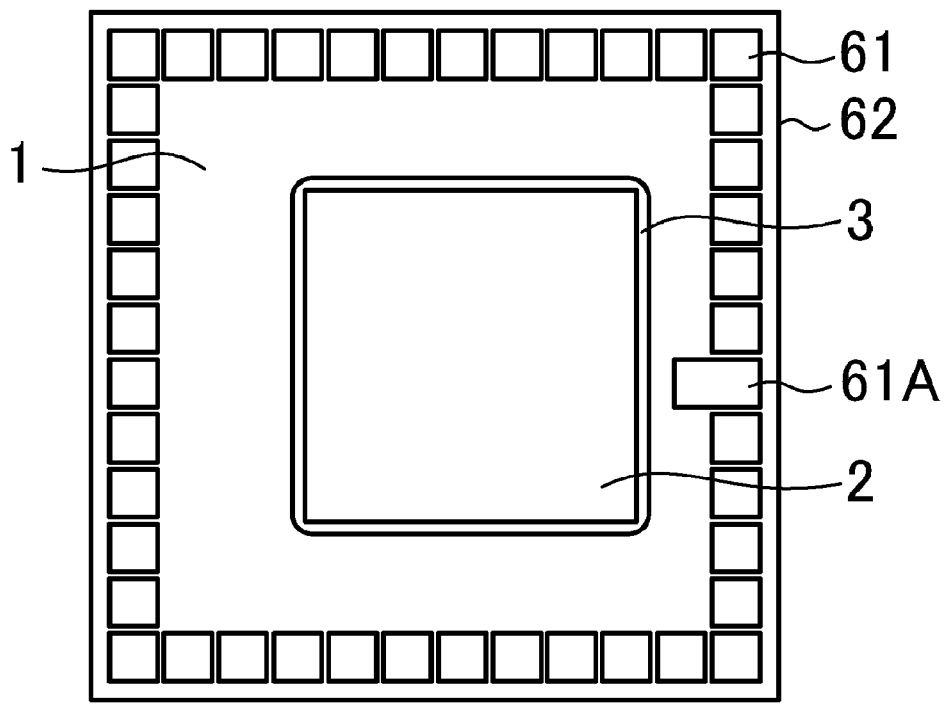
FIG. 21C is a plan view of an electronic component package according to a variation.
Figure 21D:
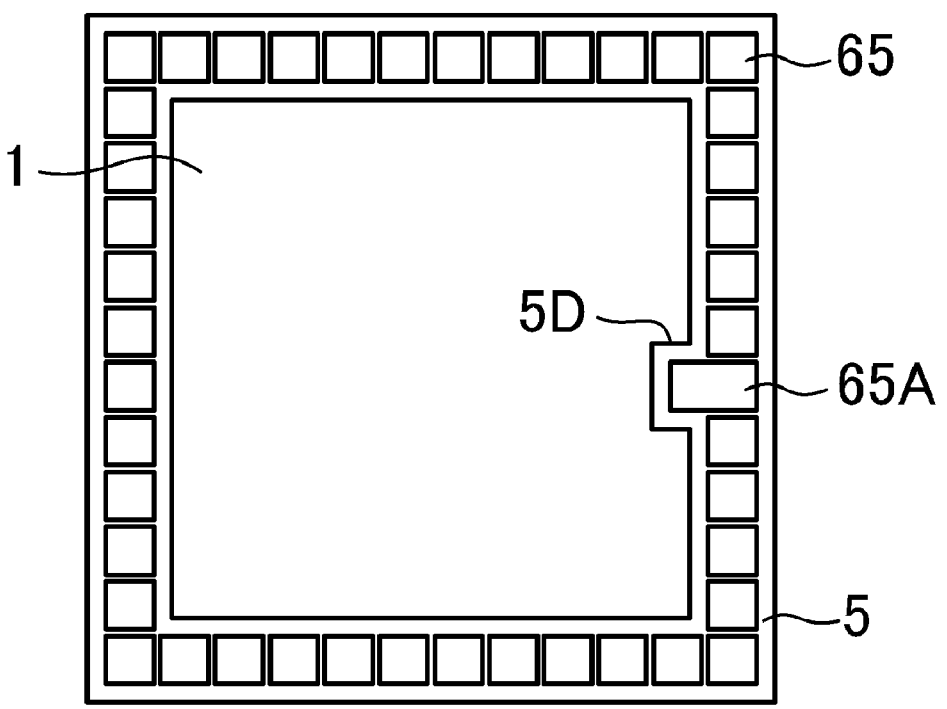
FIG. 21D is a plan view of the electronic component package according to the variation.

FIGS. 21A and 21B are, for example, plan views of the electronic component package according to the first exemplary embodiment. FIGS. 21C and 21D are plan views of an electronic component package according to the present variation.

As illustrated in FIGS. 21C and 21D, connection terminal 61A disposed on a side, of sides of main substrate 1, whose distance from semiconductor chip 2 is relatively short has an area larger than those of other connection terminals 61. Further, in frame body 5, connection terminal 65A provided at a position facing connection terminal 61A has an area larger than those of other connection terminals 65.

Here, in FIGS. 21A and 21B, at each of connection terminals 61A, 65A with large areas, a side in a direction parallel to the side facing semiconductor chip 2 is long. To the contrary, in FIGS. 21C and 21D, at each of connection terminals 61A, 65A, a side in a direction perpendicular to the side facing semiconductor chip 2 is long.

As illustrated in FIGS. 21C and 21D, when connection terminals 61A, 65A are formed, an area of a connection part can be enlarged without reducing a number of terminals that can be disposed on each side of main substrate 1 and frame body 5. In this case, a part of the side of frame body 5 on which connection terminal 65A is disposed may be thickened as indicated by sign 5D in FIG. 21D. With this configuration, a space for disposing the semiconductor chip or the electronic component can be made as wide as possible.

Further, in FIG. 21D, the present disclosure also includes a case where a width of frame body 5 at a place other than the place indicated by sign 5D is thickened.

Figure 22:
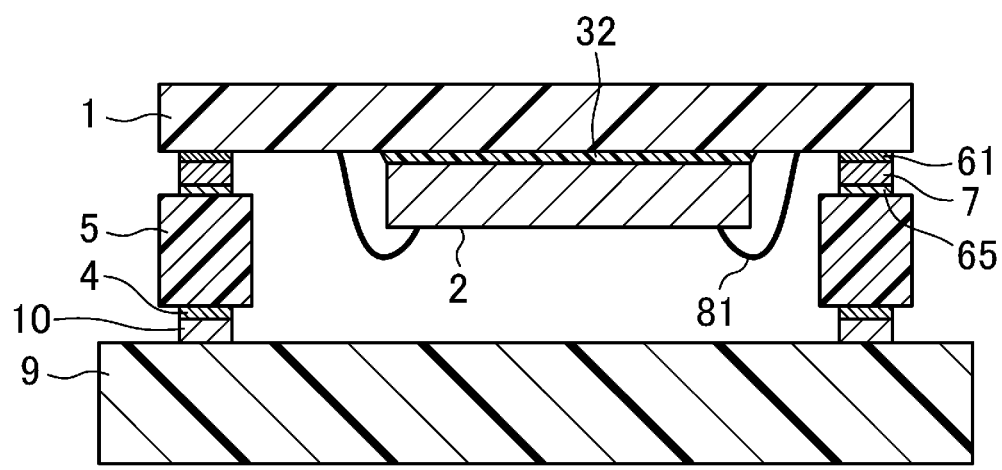
FIG. 22 is a schematic view illustrating a section of an electronic component package according to a variation.

Further, in the above-described exemplary embodiments and variations, the present disclosure also includes a case where, as illustrated in FIG. 22, semiconductor chip 2 is mounted on main substrate 1 via resin paste 32 and connected by wire bond 81.

Figure 23A:
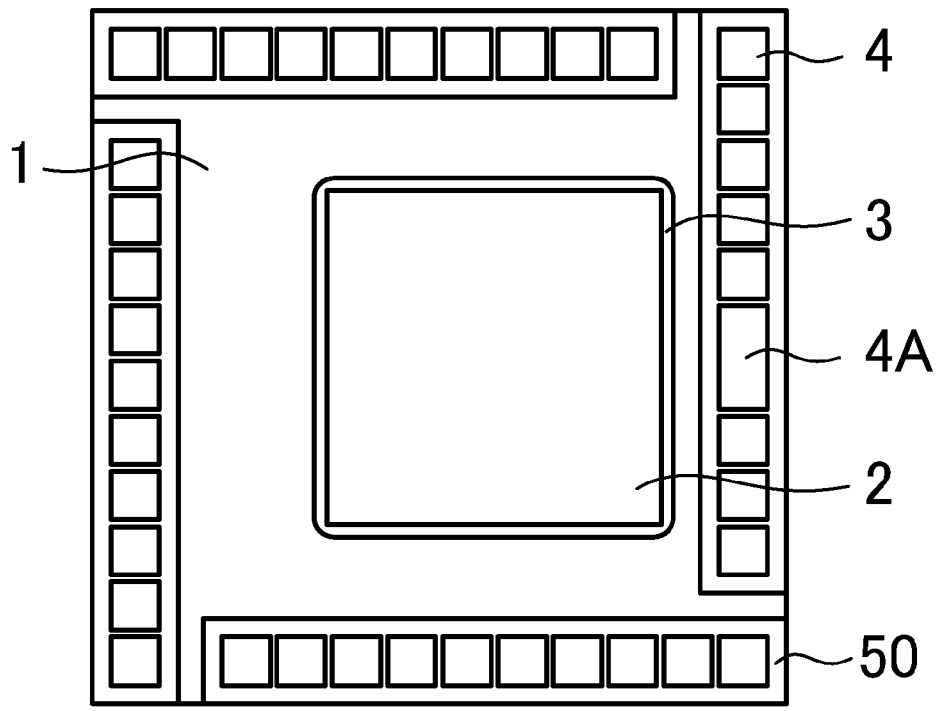
FIG. 23A is a schematic view illustrating a plane of an electronic component package according to a variation.
Figure 23B:
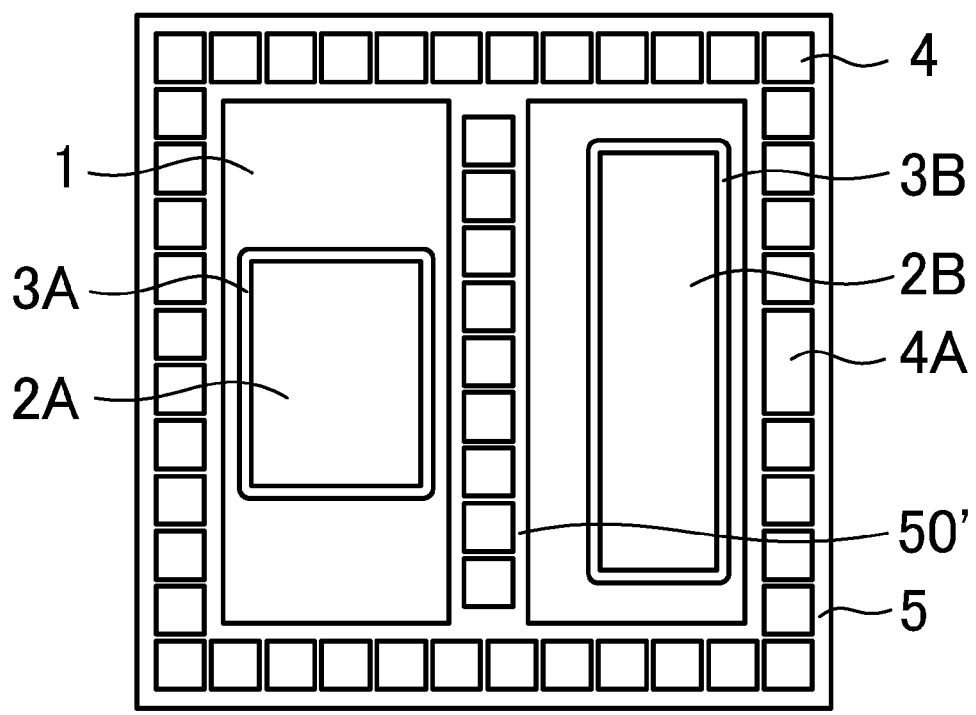
FIG. 23B is a schematic view illustrating a plane of an electronic component package according to a variation.
Figure 23C:
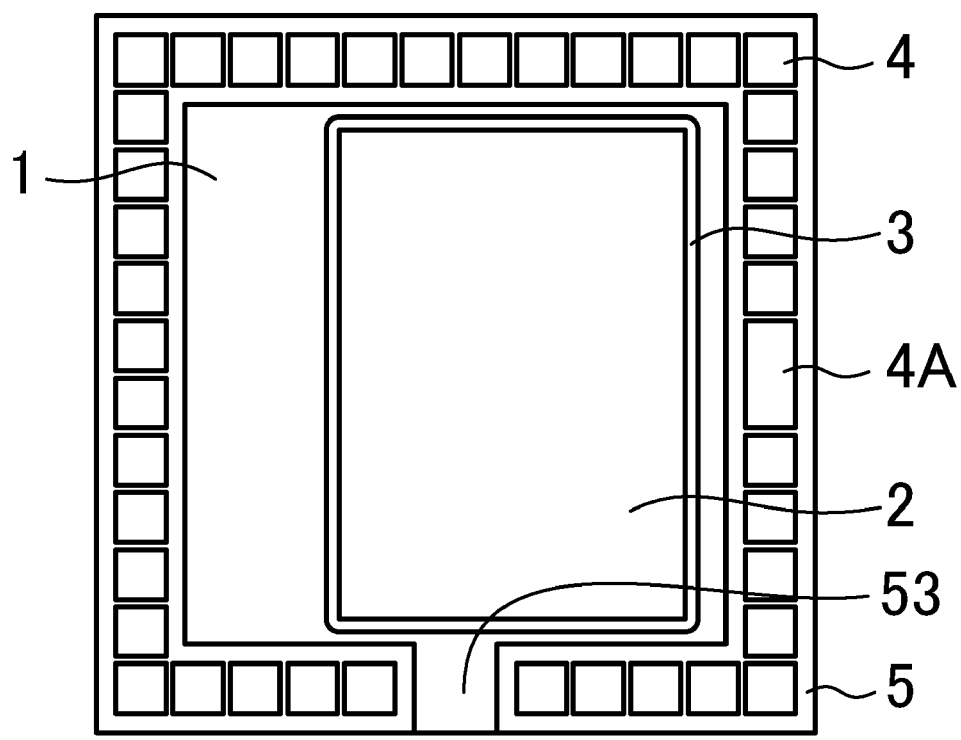
FIG. 23C is a schematic view illustrating a plane of an electronic component package according to a variation.

Further, it is not necessary that frame body 5 mounted on main substrate 1 is a perfect frame shape. For example, as illustrated in FIG. 23A, a plurality of frame bodies 50 may be disposed along each side of main substrate 1. Further, as illustrated in FIG. 23B, frame body 5 may have, for example, a partitioning part 50' at a center. Further, as illustrated in FIG. 23C, a cut-away part 53 may be formed at least at a portion of a side of frame body 5. The present disclosure also includes any of these cases.

Further, in the above-described exemplary embodiments and variations, a width of frame body 5 on a bottom surface side and a width of frame body 5 on a main surface side may be different.

The electronic component package according to the present disclosure is, for example, useful for an electronic component package mounted on a mobile device which requires miniaturization, high performance, and cost reduction.

What is claimed is:

1. An electronic component package comprising:
    a main substrate;
    a first electronic component provided on a main surface of the main substrate;
    a frame body disposed so as to face the main surface of the main substrate; and
    a first connection terminal and a second connection terminal, each of which is disposed on the main surface of the main substrate along a first side of the frame body,
    wherein the second connection terminal is disposed on the first side of the frame body at a position facing a vicinity of a midpoint of a side of the first electronic component, and
    the second connection terminal has an area larger than an area of the first connection terminal.

2. The electronic component package according to claim 1, wherein a side of the second connection terminal in a direction parallel to the first side is longer than a side of the first connection terminal.

3. The electronic component package according to claim 1, wherein a side of the second connection terminal in a direction perpendicular to the first side is longer than the side of the first connection terminal.

4. The electronic component package according to claim 1, wherein resin is filled between the main surface of the main substrate and the frame body at a portion of the first side.

5. The electronic component package according to claim 4, wherein the first electronic component is disposed on the main surface of the main substrate via resin which is the same as the resin filled between the main surface of the main substrate and the frame body.

6. The electronic component package according to claim 1, wherein a second electronic component is provided on the main surface of the main substrate, and the first electronic component has an area larger than an area of the second electronic component.

7. The electronic component package according to claim 1, wherein the first electronic component is a semiconductor chip.

8. The electronic component package according to claim 1, wherein a width of a side of a bottom surface of the frame body at a position facing the second connection terminal is wider than a width of a side of the bottom surface of the frame body at another position.

9. The electronic component package according to claim 1, wherein the second connection terminal is a dummy terminal.

10. The electronic component package according to claim 1, wherein the second connection terminal is connected to a ground part.

11. The electronic component package according to claim 1, wherein a first external terminal and a second external terminal are disposed on a bottom surface of the frame body,
    the second external terminal is electrically connected with the second connection terminal, and
    the second external terminal has an area larger than an area of the first external terminal.

12. The electronic component package according to claim 11, wherein a third external terminal and a fourth external terminal are disposed on a main surface of the frame body, and
    the fourth external terminal has an area larger than an area of the third external terminal.

13. The electronic component package according to claim 12, wherein the fourth external terminal is provided at a position facing the second external terminal.

14. The electronic component package according to claim 12, wherein the forth external terminal is provided on the main surface of the frame body at a corner of a side, of sides on the main surface, facing the first side.

15. The electronic component package according to claim 1, wherein the first side of the frame body is a side, of the respective sides of the frame body, whose distance from the first electronic component is the shortest.

* * * * *